United States Patent
Kang et al.

(10) Patent No.: US 9,287,009 B2
(45) Date of Patent: Mar. 15, 2016

(54) REPAIR CIRCUIT AND FUSE CIRCUIT

(71) Applicant: Samsung Electronics Co., Ltd., Suwon-si (KR)

(72) Inventors: Kyu-Chang Kang, Hwaseong-si (KR); Gil-Su Kim, Hwaseong-si (KR); Je-Min Ryu, Seoul (KR); Yun-Young Lee, Seongnam-si (KR); Kyo-Min Sohn, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/595,500

(22) Filed: Jan. 13, 2015

(65) Prior Publication Data

US 2015/0325316 A1 Nov. 12, 2015

(30) Foreign Application Priority Data

May 12, 2014 (KR) .......................... 10-2014-0056355

(51) Int. Cl.
*G11C 17/16* (2006.01)
*G11C 29/00* (2006.01)
*G11C 17/18* (2006.01)

(52) U.S. Cl.
CPC ................ *G11C 29/76* (2013.01); *G11C 17/16* (2013.01); *G11C 17/18* (2013.01); *G11C 29/78* (2013.01)

(58) Field of Classification Search
CPC ........ G11C 17/16; G11C 17/18; G11C 29/76; G11C 29/78
See application file for complete search history.

(56) References Cited

U.S. PATENT DOCUMENTS

| | | | |
|---|---|---|---|
| 6,618,311 B1 * | 9/2003 | Becker ................... | G11C 17/18 327/525 |
| 7,075,049 B2 | 7/2006 | Rhodes et al. | |
| 7,718,459 B2 | 5/2010 | Patrick et al. | |
| 8,063,963 B2 | 11/2011 | Dierickx | |
| 8,077,237 B2 | 12/2011 | Li | |
| 8,158,921 B2 | 4/2012 | McKee | |
| 8,426,796 B2 | 4/2013 | Mao et al. | |
| 8,575,533 B2 | 11/2013 | Yen et al. | |
| 8,599,635 B2 * | 12/2013 | Kim ....................... | G11C 17/16 365/200 |
| 8,823,070 B2 | 9/2014 | Hisanori | |

(Continued)

FOREIGN PATENT DOCUMENTS

| | | |
|---|---|---|
| JP | 2008-017536 A | 1/2008 |
| JP | 2008-205639 A | 9/2008 |

(Continued)

*Primary Examiner* — Harry W Byrne
*Assistant Examiner* — Lance Reidlinger
(74) *Attorney, Agent, or Firm* — Muir Patent Law, PLLC

(57) ABSTRACT

A repair circuit includes first and second fuse circuits, a determination circuit and an output circuit. The first fuse circuit includes a first fuse and is configured to generate a first master signal indicating whether the first fuse has been programmed. The second fuse circuit includes second fuses and is configured to generate a first address indicating whether each of the second fuses has been programmed. The determination circuit is configured to generate a detection signal based on the first master signal and the first address. The detection signal indicates whether a negative program operation has been performed on the second fuse circuit. The output circuit is configured to generate a second master signal based on the first master signal and the detection signal and generate a repair address corresponding to a defective input address based on the first address and the detection signal.

20 Claims, 14 Drawing Sheets

(56) References Cited

U.S. PATENT DOCUMENTS

| | | | |
|---|---|---|---|
| 8,848,475 B2 * | 9/2014 | Son | G11C 17/16 365/189.16 |
| 2007/0035649 A1 | 2/2007 | McKee | |
| 2008/0237446 A1 | 10/2008 | Oshikubo et al. | |
| 2013/0175582 A1 | 7/2013 | Ihara et al. | |
| 2013/0307040 A1 | 11/2013 | Ahn et al. | |
| 2014/0084143 A1 | 3/2014 | Sakano et al. | |

FOREIGN PATENT DOCUMENTS

| | | |
|---|---|---|
| JP | 2008-537340 A | 9/2008 |
| JP | 2013-021533 A | 1/2013 |
| KR | 10-2007-0053809 A | 5/2007 |
| KR | 10-2008-0031497 A | 4/2008 |
| KR | 10-2008-0038398 A | 5/2008 |
| KR | 10-2013-0087905 A | 8/2013 |

\* cited by examiner

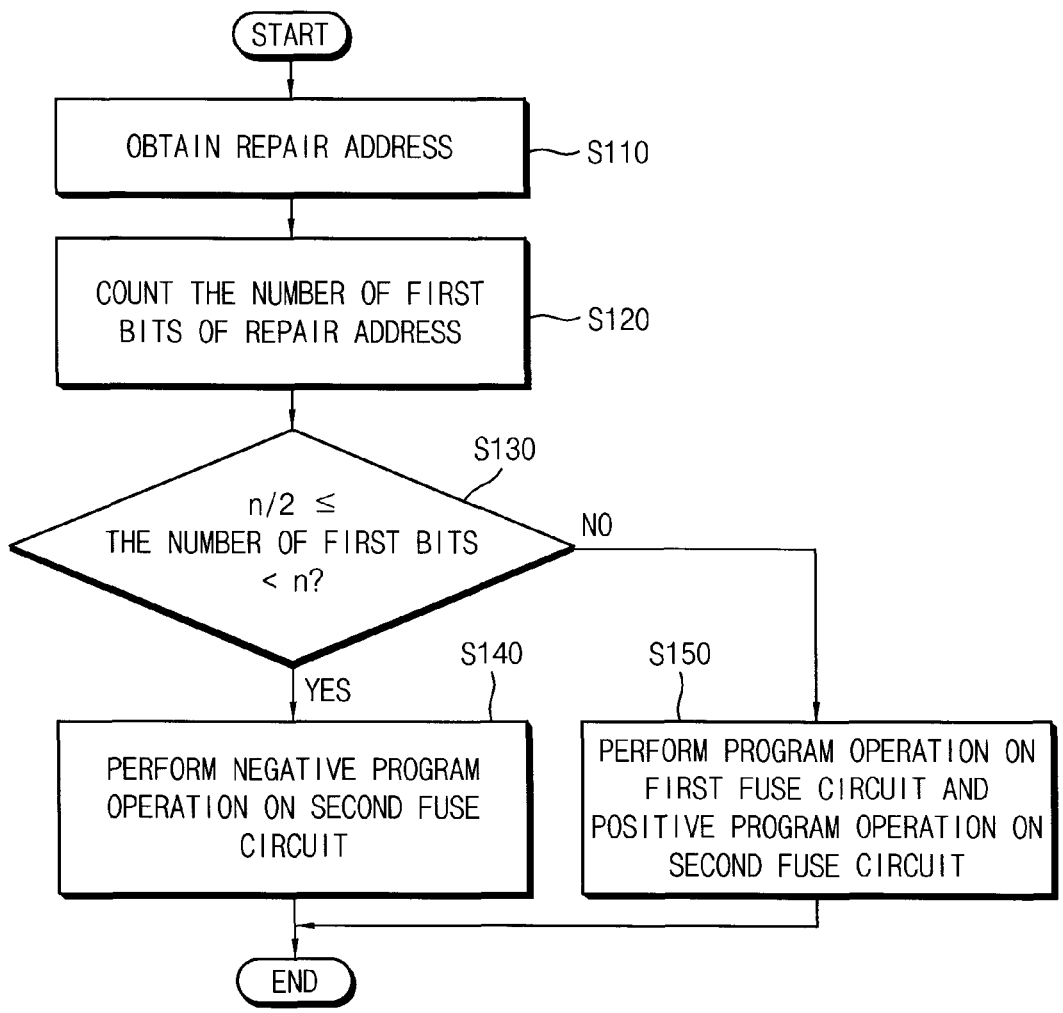

REPAIR CIRCUIT AND FUSE CIRCUIT

CROSS-REFERENCE TO RELATED APPLICATION

This application claims priority under 35 USC §119 to Korean Patent Application No. 2014-0056355, filed on May 12, 2014 in the Korean Intellectual Property Office (KIPO), the contents of which are herein incorporated by reference in their entirety.

BACKGROUND

1. Technical Field

Example embodiments relate generally to semiconductor memory devices, and more particularly to repair circuits included in semiconductor memory devices and fuse circuits included in the repair circuits.

2. Description of the Related Art

A semiconductor memory device often includes redundant memory cells and defective memory cells. When an address of the defective memory cell is input to the semiconductor memory device, a normal path is cut off and a redundancy path to the redundant memory cell is activated, and thus the defective memory cells are replaced with the redundant memory cells based on a repair address stored in fuses. The semiconductor memory device may further include a repair circuit and a fuse circuit for repairing the defective memory cell.

In general, the fuses are programmed or cut to store information about the repair address. As the number of the fuses increases, a size of the semiconductor memory device may be increased. Also, the number of fuses to be programmed increases a program time of the semiconductor memory device. Accordingly, it is desired to decrease both the number of the fuses and the number of fuses to be programmed.

SUMMARY

Some example embodiments provide a repair circuit capable of having a relatively small size.

Some example embodiments provide a fuse circuit capable of having a relatively short program time.

According to example embodiments, a repair circuit includes a first fuse circuit, a second fuse circuit, a determination circuit and an output circuit. The first fuse circuit includes a first fuse and is configured to generate a first master signal indicating whether the first fuse has been programmed. The second fuse circuit includes a plurality of second fuses and is configured to generate a first address indicating whether each of the plurality of second fuses has been programmed. The determination circuit is configured to generate a detection signal based on the first master signal and the first address. The detection signal indicates whether a negative program operation has been performed on the second fuse circuit. The output circuit is configured to generate a second master signal based on the first master signal and the detection signal. The second master signal indicates whether a program operation has been performed on the first and second fuse circuits. The output circuit is configured to generate a repair address corresponding to a defective input address based on the first address and the detection signal when the program operation has been performed on the first and second fuse circuits.

The program operation may be performed on the first fuse circuit or the second fuse circuit based on a repair control signal. The positive program operation may be performed on respective fuses of the second fuse circuit corresponding to bits having a first logic level when a number of bits having the first logic level of the repair address is smaller than a half of a number of bits of the repair address. The negative program operation may be performed on respective fuses of the second fuse circuit corresponding to bits having a second logic level opposite to the first logic level when the number of bits having the first logic level of the repair address is equal to or greater than a half of the number of bits of the repair address and is smaller than the number of bits of the repair address.

The positive program operation may be performed on respective fuses of the second fuse circuit corresponding to bits having the first logic level when the number of bits having the first logic level is equal to the number of bits of the repair address.

The determination circuit may be configured to determine whether the negative program operation has been performed on the second fuse circuit, and may activate the detection signal when at least one of bits of the first address has a first logic level and the first master signal has a second logic level opposite to the first logic level.

The output circuit may be configured to output an inverted first master signal as the second master signal and output an inverted first address as the repair address when the detection signal is activated. The output circuit may be configured to output the first master signal as the second master signal and output the first address as the repair address when the detection signal is deactivated.

In an example embodiment, the output circuit may include a first inverter, a first output switch, a plurality of second inverters and a plurality of second output switches. The first inverter may invert the first master signal. The first output switch may output one of the first master signal and the inverted first master signal as the second master signal based on the detection signal. The plurality of second inverters may invert bits of the first address signal. The plurality of second output switches may output one of the first address signal and the inverted first address signal as the repair address based on the detection signal.

In an example embodiment, the first fuse may include at least two anti-fuse elements. The at least two anti-fuse elements may be respectively programmed at different levels of a program voltage.

The at least two anti-fuse elements may be substantially simultaneously programmed.

In an example embodiment, the repair circuit may further include a repair control circuit. The repair control circuit may be configured to output either the repair address or an input address as an output address based on the second master signal. The input address may receive from an outside of a semiconductor memory device.

The repair control circuit may be configured to output the repair address as the output address when the second master signal has a first logic level and may output the input address as the output address when the second master signal has a second logic level opposite to the first logic level.

In an example embodiment, the repair control circuit may include a master latch, a plurality of address latches and a plurality of address comparators. The master latch may store a logic level of the second master signal. The plurality of address latches may store logic levels of bits of the repair address. The plurality of address comparators may output one of the repair address and the input address as the output address based on the second master signal.

According to example embodiments, a fuse circuit includes a first anti-fuse element, a first selection transistor, a first program transistor, a first switch, a second anti-fuse element, a second selection transistor, a second program transistor and a second switch. The first selection transistor is connected between the first anti-fuse element and a first node. The first program transistor is connected between the first node and a ground voltage. The first switch is connected to the first node and selectively outputs a first program output signal. The second anti-fuse element is electrically disconnected from the first anti-fuse element. The second selection transistor is connected between the second anti-fuse element and a second node. The second program transistor is connected between the second node and the ground voltage. The second switch is connected to the second node and selectively outputs a second program output signal.

A selection signal may be commonly applied to a gate electrode of the first selection transistor and a gate electrode of the second selection transistor. A program control signal may be commonly applied to a gate electrode of the first program transistor and a gate electrode of the second program transistor. The first anti-fuse element and the second anti-fuse element may be substantially simultaneously programmed when the selection signal and the program control signal are activated.

A switch control signal may be commonly applied to the first switch and the second switch. The first program output signal and the second program output signal may be substantially simultaneously output when the selection signal and the switch control signal are activated.

In an example embodiment, the fuse circuit may further include a sensing circuit. The sensing circuit may generate a sensing output signal based on a reference signal, the first program output signal and the second program output signal. The sensing output signal may indicate whether a program operation for the first and second anti-fuse elements has been performed.

The sensing circuit may be configured to determine a logic level of the sensing output signal by comparing the reference signal with a sum of the first and second program output signals.

A program voltage may be applied to a first terminal of the first anti-fuse element and a first terminal of the second anti-fuse element. The first anti-fuse element and the second anti-fuse element may be respectively programmed at different levels of the program voltage.

According to example embodiments, a semiconductor memory device includes a memory cell array, a repair circuit and an address decoder. The memory cell array includes a plurality of normal memory cells and a plurality of redundant memory cells. The repair circuit includes a master fuse and a plurality of address fuses and performs one of a positive program operation and a negative program operation based on a repair control signal when the plurality of normal memory cells include at least one defective memory cell. The address decoder selectively accesses the normal memory cells or the redundant memory cells based on an output of the repair circuit. The repair circuit includes a first fuse circuit, a second fuse circuit, a determination circuit and an output circuit. The first fuse circuit is configured to generate a first master signal indicating whether the master fuse has been programmed. The second fuse circuit is configured to generate a first address signal indicating whether each of the plurality of address fuses has been programmed. The determination circuit is configured to generate a detection signal based on the first master signal and the first address signal. The detection signal indicates whether the negative program operation has been performed on the second fuse circuit. The output circuit is configured to generate a second master signal based on the first master signal and the detection signal. The second master signal indicates whether a program operation has been performed on the first and second fuse circuits. The output circuit is configured to generate a repair address corresponding to a defective input address based on the first address and the detection signal when the program operation has been performed on the first and second fuse circuits.

In an example embodiment, the address decoder is configured to access the redundant memory cells based on the repair address when the second master signal has a first logic level and may access the normal memory cells based on the input address when the second master signal has a second logic level opposite to the first logic level.

In an example embodiment, the repair circuit may further include a repair control circuit. The repair control circuit is configured to output one of the repair address and the input address as an output address based on a logic level of the second master signal. The address decoder is configured to selectively access the normal memory cells or the redundant memory cells based on the output address.

Accordingly, the repair circuit according to example embodiments may include one master fuse for storing one repair address, may selectively perform the positive program operation or the negative program operation on the second fuse circuit including the address fuses, and thus may have a relatively small size and a relatively short program time.

In an example embodiment, a repair circuit of a semiconductor memory device is provided. The repair circuit includes a first fuse circuit, a second fuse circuit, a determination circuit, and an output circuit. The first fuse circuit including a first fuse, and is configured to output a first master signal indicating whether the first fuse has been programmed. The second fuse circuit includes a plurality of second fuses. Each of the second fuses is configured to be programmed based on a result of comparing a number of bits of a defective input address having a first logic level with a number of bits of the defective input address having a second logic level opposite to the first logic level. The second fuse circuit is configured to generate a first address using the second fuses based on a program operation that depends on the result of comparing. The determination circuit is configured to generate a detection signal based on the first master signal and the first address, the detection signal indicating whether a negative program operation has been performed on the second fuse circuit. The output circuit is configured to output either the first address or a second address that is an inverted address of the first address as a repair address in response to the detection signal, wherein a logic level of each of the bits of the repair address is the same as that of the defective input address.

In addition, the fuse circuit according to example embodiments may include two anti-fuse elements that are respectively programmed at the different levels of the program voltage. The two anti-fuse elements may be electrically disconnected from each other and may be substantially simultaneously programmed. Thus, the fuse circuit may have a relatively short program time.

Accordingly, the semiconductor memory device including the repair circuit and/or the fuse circuit may have a relatively short test time.

BRIEF DESCRIPTION OF THE DRAWINGS

Illustrative, non-limiting example embodiments will be more clearly understood from the following detailed description taken in conjunction with the accompanying drawings.

FIG. 1 is a block diagram illustrating a repair circuit according to example embodiments.

FIGS. 2A and 2B are diagrams for describing a positive program operation and a negative program operation performed in the repair circuit of FIG. 1.

FIG. 3 is a flow chart illustrating an operation of the repair circuit of FIG. 1 according to an example embodiment.

DETAILED DESCRIPTION OF THE EMBODIMENTS

Figures 1, 2A:
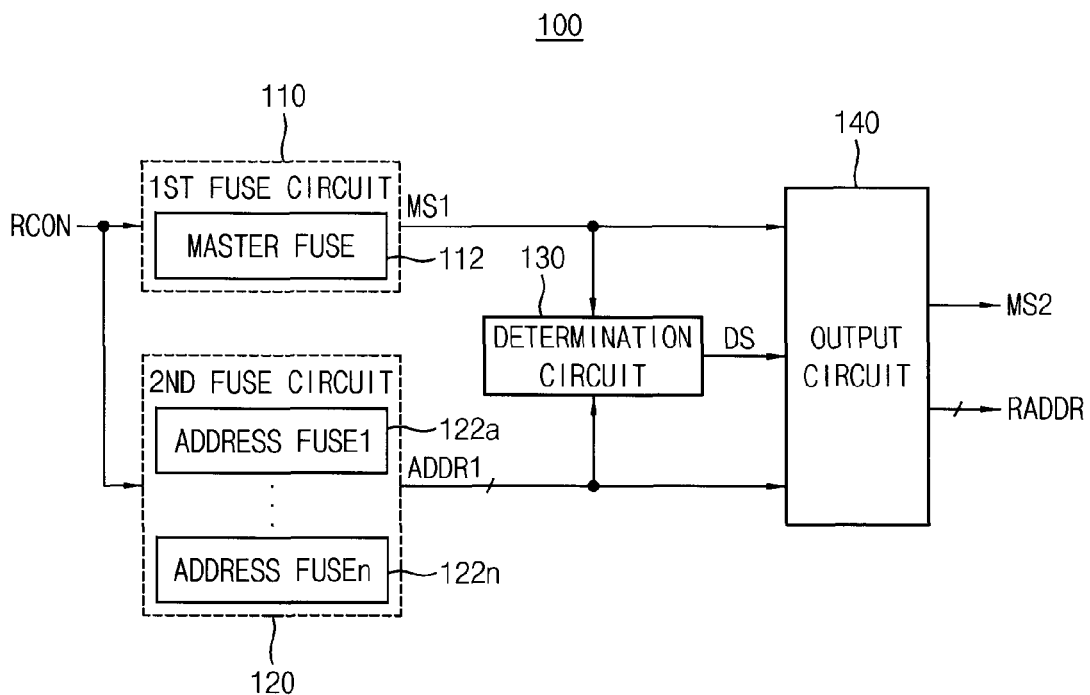

Various example embodiments will be described more fully with reference to the accompanying drawings, in which embodiments are shown. This present disclosure may, however, be embodied in many different forms and should not be construed as limited to the embodiments set forth herein. Like reference numerals refer to like elements throughout this application.

It will be understood that, although the terms first, second, etc. may be used herein to describe various elements, these elements should not be limited by these terms. Unless indicated otherwise, these terms are used only to distinguish one element from another. For example, a first element could be termed a second element, and, similarly, a second element could be termed a first element, without departing from the scope of the inventive concept. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, or as "contacting" another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other.

Unless the context indicates otherwise, terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a repair circuit according to example embodiments.

Referring to FIG. 1, a repair circuit 100 includes a first fuse circuit 110, a second fuse circuit 120, a determination circuit 130 and an output circuit 140. As used herein, a semiconductor device may refer to various items such as a memory device, one or more logic devices or memory cells formed in or on a semiconductor substrate, a semiconductor chip, a memory chip, a logic chip, a package, or combinations thereof. A semiconductor device such as a semiconductor chip, a memory chip, or a logic chip may be formed from a wafer. A semiconductor device may include one or more chips stacked on a package substrate, or a package-on-package device including a plurality of packages. An electronic device, as used herein, may refer to one of these devices and may also include products that include these devices, such as a memory module, a hard drive including additional components, a mobile phone, laptop, tablet, desktop, camera, server, computing system, or other consumer electronic device, etc. As used herein, a repair circuit may be included in at least one of these devices.

The first fuse circuit 110 includes a master fuse (e.g., a first fuse) 112 and generates a first master signal MS1 that indicates whether the master fuse 112 has been programmed. For example, the first master signal MS1 may have a first logic level (e.g., "1") when the master fuse 112 has been programmed and may have a second logic level (e.g., "0") when the master fuse 112 is unprogrammed.

The master fuse 112 may be implemented with a fuse circuit that includes at least one anti-fuse element. The master fuse 112 may be programmed when the at least one anti-fuse element is ruptured. In addition, the first master signal MS1 output from the first fuse circuit 110 may correspond to a sensing output signal of the fuse circuit that indicates whether a rupturing operation for the at least one anti-fuse element has been performed.

In some example embodiments, the master fuse 112 may include one anti-fuse element and may further include one selection transistor, one program transistor and one switch. In other example embodiments, to improve program characteristics of the master fuse 112, the master fuse 112 may include two anti-fuse elements and may further include one selection transistor, one program transistor and one switch. In the example of the master fuse having two anti-fuse elements, one selection transistor, one program transistor and one switch, the two anti-fuse elements may be electrically connected to each other and may be substantially simultaneously or sequentially programmed. In still other example embodiments, to improve the program characteristics of the master fuse 112, the master fuse 112 may include two anti-fuse elements and may further include two selection transistors, two program transistors and two switches. In the example of the master fuse having two anti-fuse elements, two selection transistors, two program transistors and two switches, as will be described with reference to FIG. 9, the two anti-fuse elements may be electrically disconnected from each other and may be substantially simultaneously programmed.

The second fuse circuit 120 includes a plurality of address fuses (e.g., a plurality of second fuses) 122a, . . . , 122n and generates a first address signal ADDR1 that indicates whether each of the plurality of address fuses 122a, . . . , 122n has been programmed. The first address signal ADDR1 may include a plurality of bits. For example, each bit of the first address signal ADDR1 may have the first logic level (e.g., "1") when a respective one address fuse has been programmed and may have the second logic level (e.g., "0") when the respective one address fuse is unprogrammed. The second fuse circuit 120 may store a repair address RADDR for a repair operation that replaces defective memory cells with redundant memory cells. For example, if the second fuse circuit 120 includes n address fuses, where n is a natural number equal to or greater than two, the first address signal ADDR1 may be an n-bit signal that corresponds to an n-bit repair address.

In one embodiment, each of the plurality of address fuses 122a, . . . , 122n may have a structure that is substantially the same as a structure of the master fuse 112. For example, each of the plurality of address fuses 122a, . . . , 122n may be implemented with a fuse circuit that includes at least one anti-fuse element. Each bit of the first address signal ADDR1 output from the second fuse circuit 120 may correspond to a sensing output signal of the fuse circuit that indicates whether a rupturing operation for the at least one anti-fuse element has been performed.

During a fuse program operation mode, a program operation is performed on the fuses. The fuse program operation may include a positive program operation or a negative program operation according to how to store data into the fuses, for example, with inversion or without inversion. In some example embodiments, one of the positive program operation and the negative program operation may be performed on the second fuse circuit 120 based on a repair control signal RCON that is provided from an external device (e.g., a memory controller 810 in FIG. 16 or a test device 910 in FIG. 17). The positive program operation may indicate that the repair address RADDR is stored without inverting bits of the repair address RADDR. The negative program operation may indicate that the bits of the repair address RADDR are inverted and the inverted repair address is stored. As will be described with reference to FIG. 9, the repair control signal RCON may include a program voltage, a selection signal, a program control signal, a switch control signal, etc.

In certain systems, when a group of fuses of a set of fuses are ruptured to program the set of fuses to correspond to a repair address, the fuses that represent the bit "1" are ruptured, and fuses that represent the bit "0" are not ruptured. However, fuse programming can lead to certain problems, as discussed previously. Therefore, in certain embodiments described herein, instead of performing this "positive program operation," a "negative program operation" procedure is used, where fuses that represent the bit "0" are programmed, and fuses that represent the bit "1" are not programmed. For example, if certain of the addresses that are defective include more ones than zeroes, then it would require less programing if the "0" bits were programmed, and the "1" bits were not programmed. In this situation, the address programmed using the set of fuses is actually an inverse address of the repair address. Therefore, as described further below, when it is determined whether a positive program operation or a negative program operation should be used for one or more fuse addresses, additional information should be included to indicate whether those particular fuse addresses are inversely programmed.

FIGS. 2A and 2B are diagrams for describing the positive program operation and the negative program operation performed in the repair circuit of FIG. 1.

FIG. 2A is an exemplary table for describing the positive program operation, and FIG. 2B is an exemplary table for describing the negative program operation. In FIGS. 2A and 2B, the positive program operation and the negative program operation will be described based on an example where the repair address (i.e., defective input address) is a 7-bit address and the repair circuit includes seven address fuses. In FIGS. 2A and 2B, A1, A2, A3, A4, A5 A6 and A7 may indicate the bits of the repair address, FMST may indicate the master fuse that is included in the first fuse circuit 110, and F1, F2, F3, F4, F5, F6 and F7 may indicate the address fuses that are included in the second fuse circuit 120 and correspond to the bits of the repair address. For example, a bit A1 of the repair address may correspond to an address fuse F1. PG may indicate a programmed state of a fuse (e.g., the master fuse or the address fuse), and NP may indicate an unprogrammed state of the fuse.

Referring to FIG. 2A, first bits A4 and A5 of the repair address have the first logic level (e.g., "1") and second bits A1, A2, A3, A6 and A7 of the repair address have the second logic level (e.g., "0"). When the positive program operation is performed, the master fuse FMST may be programmed, address fuses F4 and F5 corresponding to the first bits A4 and A5 of the repair address may be programmed, and address fuses F1, F2, F3, F6 and F7 corresponding to the second bits A1, A2, A3, A6 and A7 of the repair address may be unprogrammed. After the positive program operation is performed, the repair address may be stored in the address fuses F1, . . . , F7 without inverting bits of the repair address, and the repair circuit may provide outputs of the address fuses F1, . . . , F7 as the repair address.

Referring to FIG. 2B, first bits A1, A3, A5, A6 and A7 of the repair address have the first logic level (e.g., "1") and second bits A2 and A4 of the repair address have the second logic level (e.g., "0"). When the negative program operation is performed, the master fuse FMST may be unprogrammed, address fuses F1, F3, F5, F6 and F7 corresponding to the first bits A1, A3, A5, A6 and A7 of the repair address may be unprogrammed, and address fuses F2 and F4 corresponding to the second bits A2 and A4 of the repair address may be programmed. After the negative program operation is performed, the inverted repair address may be stored in the address fuses F1, . . . , F7, and the repair circuit may invert outputs of the address fuses F1, . . . , F7 and may provide the inverted outputs of the address fuses F1, . . . , F7 as the repair address.

Referring back to FIG. 1, the determination circuit 130 generates a detection signal DS based on the first master signal MS1 and the first address signal ADDR1. The detection signal DS indicates whether the negative program operation has been performed on the second fuse circuit 120. For example, when at least one of the bits of the first address signal ADDR1 has the first logic level (e.g., "1") and the first master signal MS1 has the second logic level (e.g., "0"), the determination circuit 130 may determine that the negative program operation has been performed and may activate the detection signal DS.

The output circuit 140 generates a second master signal MS2 based on the first master signal MS1 and the detection signal DS. The second master signal MS2 indicates whether a program operation has been performed on the first fuse circuit 110 and the second fuse circuit 120. The output circuit 140 generates the repair address RADDR corresponding to a defective input address based on the first address signal ADDR1 and the detection signal DS when the program operation has been performed on the first and second fuse circuits 110 and 120.

For example, when the detection signal DS is activated, the output circuit 140 may invert the first master signal MS1 to output the inverted first master signal as the second master signal MS2 and may invert the bits of the first address signal ADDR1 to outputs the inverted first address signal as the repair address RADDR. When the detection signal DS is deactivated, the output circuit 140 may output the first master signal MS1 as the second master signal MS2 and may output the first address signal ADDR1 as the repair address RADDR. The second master signal MS2 may have the first logic level (e.g., "1") when a program operation has been performed on the first fuse circuit 110 or the second fuse circuit 120 and may have the second logic level (e.g., "0") when the program operation has not been performed on the both first fuse circuit 110 and the second fuse circuit 120.

The repair circuit 100 according to example embodiments may effectively store and output the repair address RADDR. The repair circuit 100 may be included in a semiconductor memory device, and the repair address RADDR may be used for replacing the defective memory cells with the redundant memory cells when the semiconductor memory device includes at least one defective memory cell. The repair circuit 100 may selectively perform the positive program operation or the negative program operation based on the number of the bits of the repair address RADDR having the first logic level (e.g., "1"). In addition, the repair circuit 100 may include a single master fuse 112 and may selectively perform the positive program operation or the negative program operation on the second fuse circuit 120 including the plurality of address fuses 122a, . . . , 122n. Accordingly, the repair circuit 100 may have a relatively small size and a relatively short program time that is required to store the repair address RADDR.

FIG. 3 is a flow chart illustrating an operation of the repair circuit of FIG. 1 according to an example embodiment. FIG. 3 illustrates an example where the repair circuit 100 of FIG. 1 performs a program operation on the first fuse circuit 110 or the second fuse circuit 120 (e.g., an example where the repair circuit 100 of FIG. 1 operates during the fuse program mode).

Referring to FIGS. 1 and 3, the repair address RADDR having n bits is obtained by performing a test operation on a semiconductor memory device (e.g., a semiconductor memory device 820 in FIG. 16 or a semiconductor memory device 920 in FIG. 17) that includes the repair circuit 100 (step S110). The number of the first bits of the repair address RADDR is counted (step S120). Each of the first bits has the first logic level (e.g., "1"). A program scheme for the first and second fuse circuits 110 and 120 may be determined based on the number of the first bits of the repair address RADDR, and the repair control signal RCON for performing a program operation may be generated based on the determined program scheme.

In one embodiment, when the number of the first bits of the repair address RADDR is equal to or greater than n/2 and is less than n (step S130: YES), where n is a natural number equal to or greater than two, the negative program operation is performed on the second fuse circuit 120 (step S140). For example, n may correspond to the number of all bits of the repair address RADDR and the number of all address fuses 122a, . . . , 122n included in the second fuse circuit 120.

For example, if it is assumed that the repair address RADDR is a 7-bit address, the negative program operation may be performed when the number of the first bits of the repair address RADDR is four, five or six. As described above with reference to FIG. 2B, the master fuse 112 may be unprogrammed, address fuses corresponding to the first bits (e.g., "1") of the repair address RADDR may be unprogrammed, and address fuses corresponding to second bits (e.g., "0") of the repair address RADDR may be programmed. Each of the second bits may have the second logic level (e.g., "0").

In one embodiment, when the number of the first bits of the repair address RADDR is smaller than n/2 or is equal to n (step S130: NO), a program operation is performed on the first fuse circuit 110 and the positive program operation is performed on the second fuse circuit 120 (step S150).

For example, if it is assumed that the repair address RADDR is the 7-bit address, the positive program operation may be performed when the number of the first bits of the repair address RADDR is zero, one, two, three or seven. As described above with reference to FIG. 2A, the master fuse 112 may be programmed, address fuses corresponding to the first bits of the repair address RADDR may be programmed, and address fuses corresponding to the second bits of the repair address RADDR may be unprogrammed.

As will be described with reference to FIGS. 16 and 17, the steps S110, S120 and S130 may be performed by the external device (e.g., the memory controller 810 in FIG. 16 or the test device 910 in FIG. 17) that is located external to the semiconductor memory device (e.g., the semiconductor memory device 820 in FIG. 16 or the semiconductor memory device 920 in FIG. 17).

Figure 4:
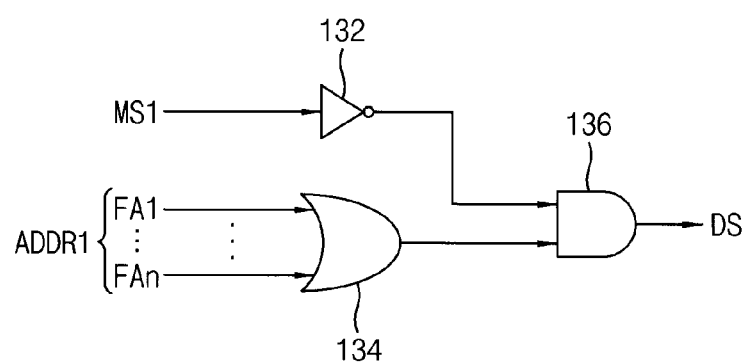
FIG. 4 is a diagram illustrating an example of a determination circuit included in the repair circuit of FIG. 1 according to one embodiment.

FIG. 4 is a diagram illustrating an example of a determination circuit included in the repair circuit of FIG. 1 according to one embodiment.

Referring to FIG. 4, a determination circuit 130 may include an inverter 132, an OR gate 134 and an AND gate 136.

The inverter 132 inverts the first master signal MS1. The OR gate 134 performs an OR operation on bits FA1, . . . , FAn of the first address signal ADDR1. The AND gate 136 generates the detection signal DS by performing an AND operation on an output of the inverter 132 and an output of the OR gate 134. When the first fuse circuit 110 is not programmed and the negative program operation has been performed on the second fuse circuit 120, the detection signal DS may be activated and may have the first logic level (e.g., "1"). For example, when the first fuse circuit 110 has been programmed and the positive program operation and the negative program operation have not been performed on the second fuse circuit 120, the detection signal DS may be deactivated and may have the second logic level (e.g., "0"). For another example, when the first fuse circuit 110 has been programmed and the positive program operation has been performed on the second fuse circuit 120, or the first fuse circuit 110 has not been programmed and the positive program operation and the negative program operation have not been performed on the second fuse circuit 120, the detection signal DS may be deactivated and may have the second logic level (e.g., "0").

According to example embodiments, the determination circuit 130 may have any structure for activating the detection signal DS when at least one of the bits FA1, . . . , FAn of the first address signal ADDR1 has the first logic level and the first master signal MS1 has the second logic level.

Figure 5:
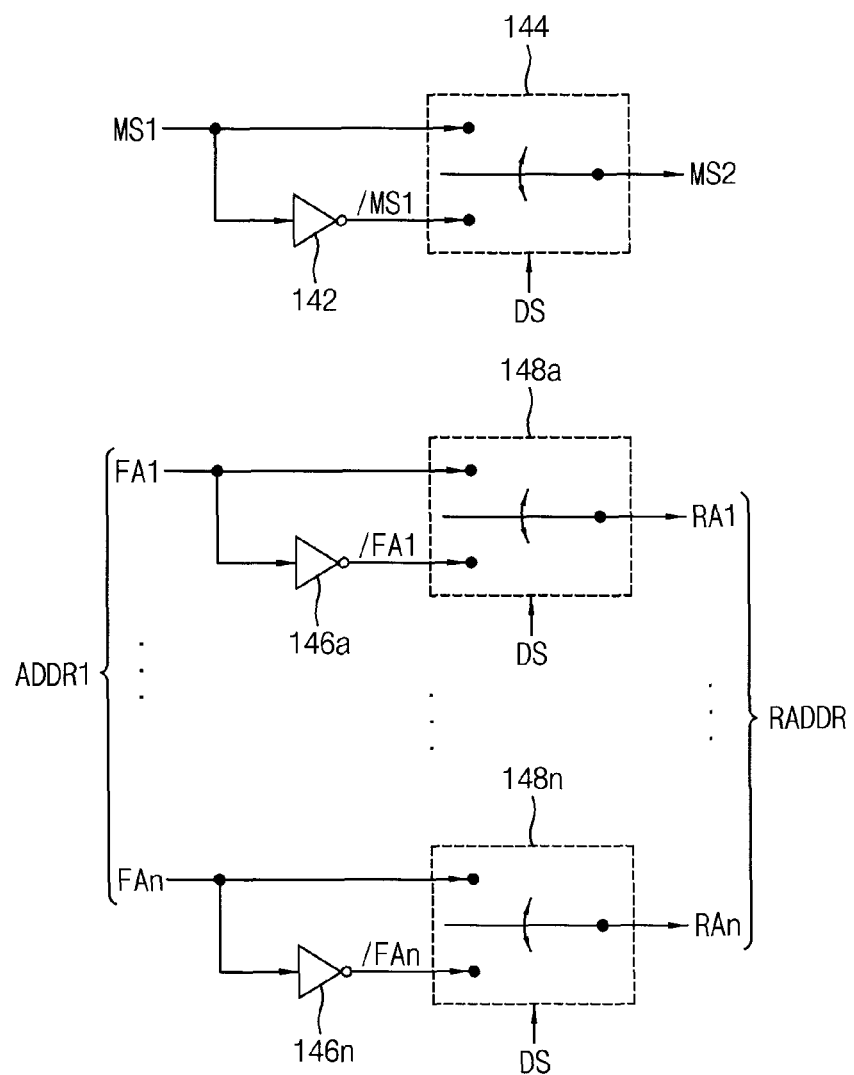
FIG. 5 is a diagram illustrating an example of an output circuit included in the repair circuit of FIG. 1 according to one embodiment.

FIG. 5 is a diagram illustrating an example of an output circuit included in the repair circuit of FIG. 1 according to one embodiment.

Referring to FIG. 5, an output circuit 140 includes a first inverter 142, a first output switch 144, a plurality of second inverters 146a, . . . , 146n and a plurality of second output switches 148a, . . . , 148n. The amount n may be the number of bits of a defective input address (e.g., a repair address).

The first inverter 142 inverts the first master signal MS1. The first output switch 144 outputs one of the first master signal MS1 and the inverted first master signal /MS1 as the second master signal MS2 based on the detection signal DS. For example, when the detection signal DS is activated (e.g., "1"), the inverted first master signal /MS1 may be output as the second master signal MS2. When the detection signal DS is deactivated (e.g., "0"), the first master signal MS1 may be output as the second master signal MS2.

The plurality of second inverters 146a, . . . , 146n invert the bits FA1, . . . , FAn of the first address signal ADDR1 and output the inverted bits /FA1, . . . , /FAn as the repair address RADDR. Each of the plurality of second output switches 148a, . . . , 148n outputs one of the respective bits FA1, . . . , FAn of the first address signal ADDR1 and the respective inverted bits /FA1, . . . , /FAn of the inverted first address signal /ADDR1 as the repair address RADDR based on the detection signal DS.

For example, a second switch 148a may output one of a bit FA1 of the first address signal ADDR1 and an inverted bit /FA1 of the inverted first address signal /ADDR1 as a bit RA1 of the repair address RADDR based on the detection signal DS. A second switch 148n may output one of a bit FAn of the first address signal ADDR1 and an inverted bit /FAn of the inverted first address signal /ADDR1 as a bit RAn of the repair address RADDR based on the detection signal DS. When the detection signal DS is activated, the inverted bits /FA1, . . . , /FAn may be output as the bits RA1, . . . , RAn of the repair address RADDR. When the detection signal DS is deactivated, the bits FA1, . . . , FAn may be output as the bits RA1, . . . , RAn of the repair address RADDR.

According to example embodiments, the output circuit 140 may have any structure for outputting one of the first master signal MS1 and the inverted first master signal /MS1 based on the detection signal DS and for outputting one of the first address signal ADDR1 and the inverted first address signal /ADDR1 based on the detection signal DS.

Figure 6:
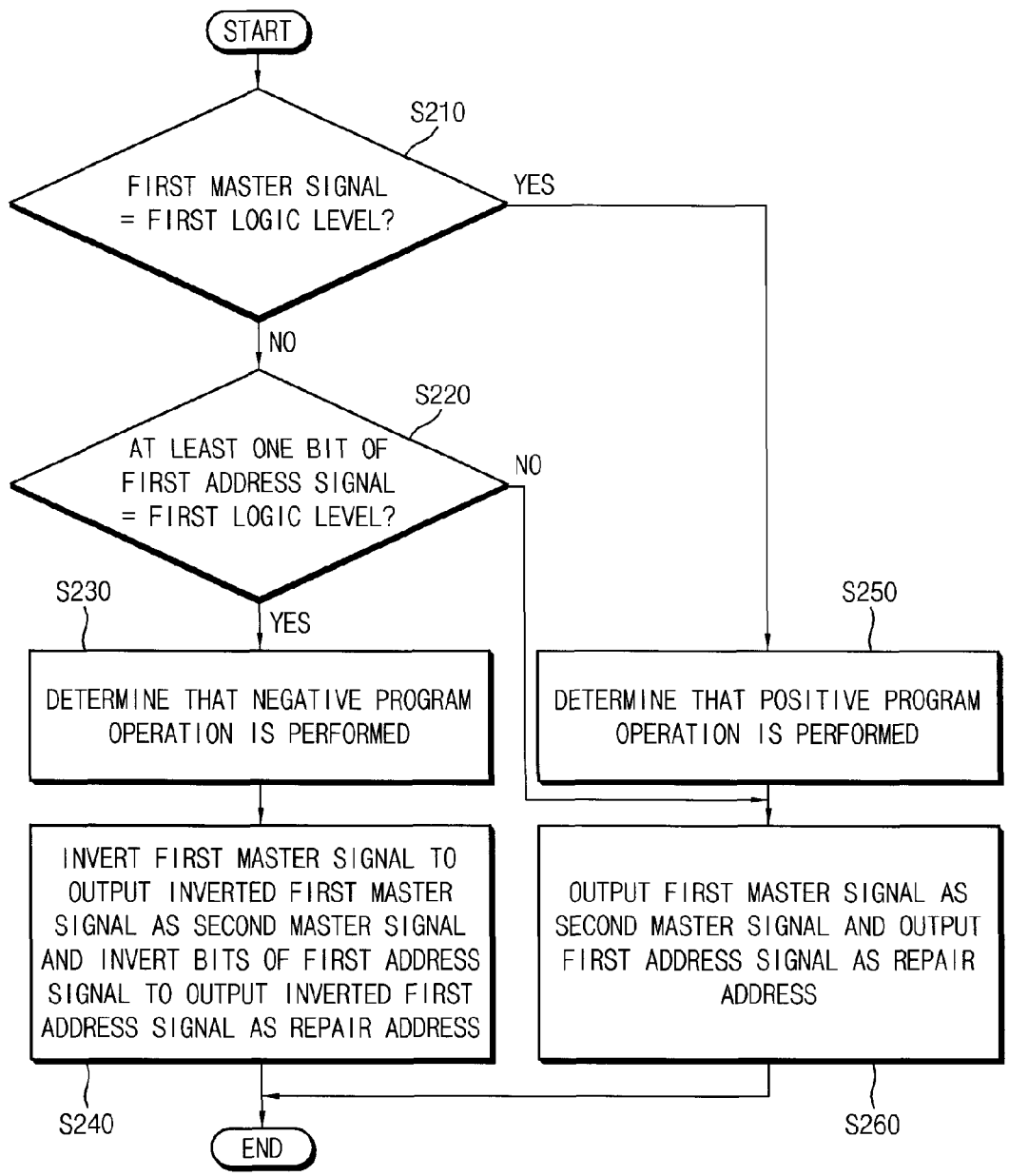
FIG. 6 is a flow chart illustrating an operation of the repair circuit of FIG. 1 according to one embodiment.

FIG. 6 is a flow chart illustrating an operation of the repair circuit of FIG. 1 according to one embodiment. FIG. 6 illustrates an example where the repair circuit 100 of FIG. 1 generates the repair address RADDR after one of the positive program operation and the negative program operation is performed on the second fuse circuit 120 (e.g., an example where the repair circuit 100 of FIG. 1 operates in a sensing mode).

Referring to FIGS. 1 and 6, the determination circuit 130 determines whether one of the positive program operation and the negative program operation has been performed based on a logic level of the first master signal MS1 and logic levels of the bits of the first address signal ADDR1.

When the first master signal MS1 has the first logic level (e.g., "1") (step S210: YES), the determination circuit 130 may determine that the positive program operation has been performed on the second fuse circuit 120 (step S250) and may deactivate the detection signal DS. The output circuit 140 may output the first master signal MS1 as the second master signal MS2 based on the deactivated detection signal DS and may output the first address signal ADDR1 as the repair address RADDR based on the deactivated detection signal DS (step S260).

When the first master signal MS1 has the second logic level (e.g., "0") (step S210: NO), and when the at least one of the bits of the first address signal ADDR1 has the first logic level (step S220: YES), the determination circuit 130 may determine that the negative program operation has been performed on the second fuse circuit 120 (step S230) and may activate the detection signal DS. The output circuit 140 may invert the first master signal MS1 to output the inverted first master signal /MS1 as the second master signal MS2 based on the activated detection signal DS and may invert the bits of the first address signal ADDR1 to output the inverted first address signal /ADDR1 as the repair address RADDR based on the activated detection signal DS (step S240).

When the first master signal MS1 has the second logic level (e.g., "0") (step S210: NO), and when all bits of the first address signal ADDR1 have the second logic levels (step S220: NO), the determination circuit 130 may determine that both the positive program operation and the negative program operation have not been performed and may deactivate the detection signal DS. The output circuit 140 may output the first master signal MS1 as the second master signal MS2 based on the deactivated detection signal DS and may output the first address signal ADDR1 as the repair address RADDR based on the deactivated detection signal DS (step S260). If the second master signal MS2 has the second logic level, the repair address RADDR may not be used in the semiconductor memory device including the repair circuit 100.

Figure 7:
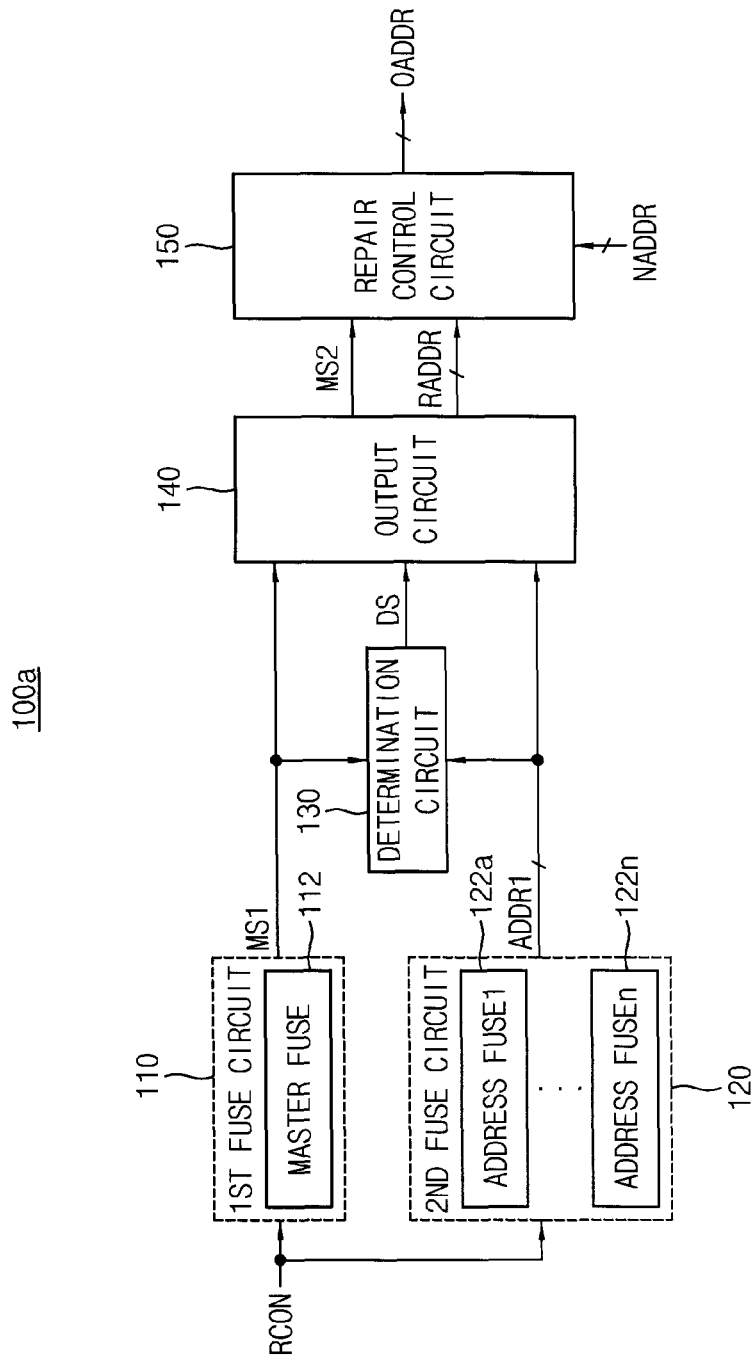
FIG. 7 is a block diagram illustrating a repair circuit according to example embodiments.

FIG. 7 is a block diagram illustrating a repair circuit according to example embodiments.

Referring to FIG. 7, a repair circuit 100a includes a first fuse circuit 110, a second fuse circuit 120, a determination circuit 130 and an output circuit 140. The repair circuit 100a may further include a repair control circuit 150.

The first fuse circuit 110, the second fuse circuit 120, the determination circuit 130 and the output circuit 140 included in the repair circuit 100a of FIG. 7 may be substantially the same as the first fuse circuit 110, the second fuse circuit 120, the determination circuit 130 and the output circuit 140 included in the repair circuit 100 of FIG. 1, respectively.

The repair control circuit 150 may generate an output address OADDR based on the second master signal MS2, the repair address RADDR and the normal address NADDR. The normal address NADDR may be an input address received from outside the semiconductor memory device. For example, when the second master signal MS2 has the first logic level (e.g., "1"), the repair control circuit 150 may output the repair address RADDR as the output address OADDR. When the second master signal MS2 has the second logic level (e.g., "0"), the repair control circuit 150 may output the normal address NADDR as the output address OADDR.

Figure 8:
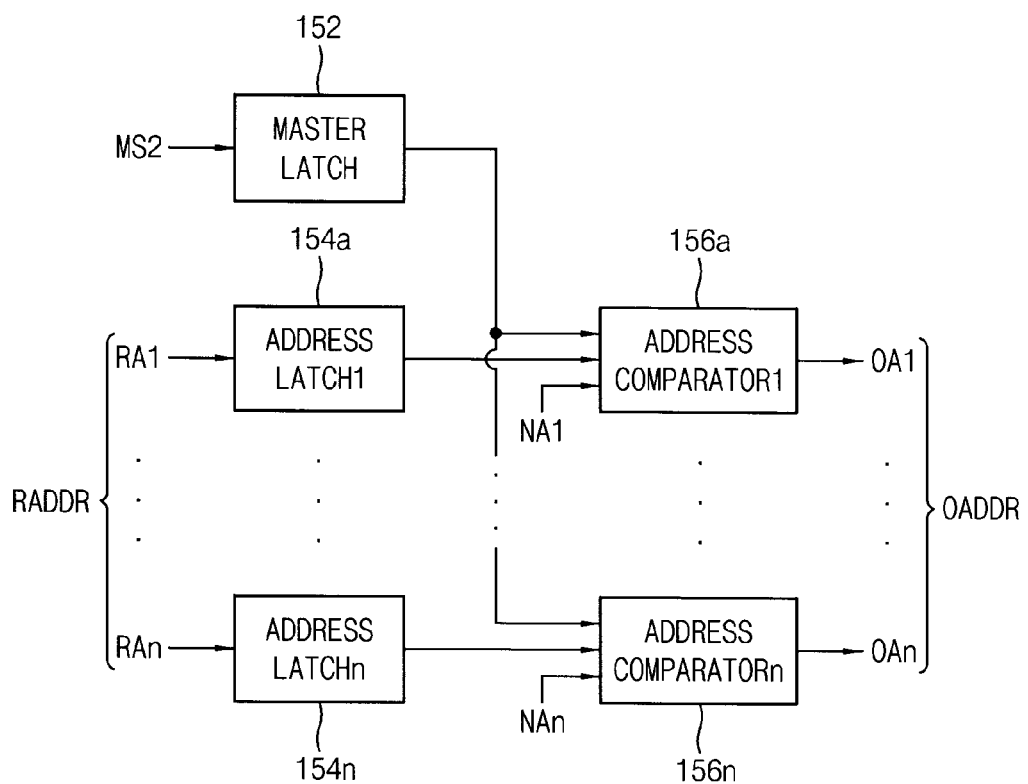
FIG. 8 is a diagram illustrating an example of a repair control circuit included in the repair circuit of FIG. 7 according to one embodiment.

FIG. 8 is a diagram illustrating an example of a repair control circuit included in the repair circuit of FIG. 7 according to one embodiment.

Referring to FIG. 8, a repair control circuit 150 may include a master latch 152, a plurality of address latches 154a, ..., 154n and a plurality of address comparators 156a, ..., 156n.

The master latch 152 may store a logic level of the second master signal MS2. The plurality of address latches 154a, ..., 154n may store logic levels of the bits RA1, ..., RAn of the repair address RADDR. For example, a first address latch 154a may store a logic level of the bit RA1 of the repair address RADDR, and an n-th address latch 154n may store a logic level of the bit RAn of the repair address RADDR.

The plurality of address comparators 156a, ..., 156n may output one of the repair address RADDR stored in the plurality of address latches 154a, ..., 154n and the normal address NADDR received from the external device as the output address OADDR based on the second master signal MS2 stored in the master latch 152. For example, a first address comparator 156a may output the bit RA1 of the repair address RADDR as a bit OA1 of the output address OADDR when the second master signal MS2 has the first logic level (e.g., "1") and may output a bit NA1 of the normal address NADDR as the bit OA1 of the output address OADDR when the second master signal MS2 has the second logic level (e.g., "0"). An n-th address comparator 156n may output the bit RAn of the repair address RADDR as a bit OAn of the output address OADDR when the second master signal MS2 has the first logic level and may output a bit NAn of the normal address NADDR as the bit OAn of the output address OADDR when the second master signal MS2 has the second logic level.

According to example embodiments, the repair control circuit 150 may have any structure for selectively outputting the repair address RADDR or the normal address NADDR based on the second master signal MS2.

Although the example embodiments are described above based on the repair circuit storing one repair address, the repair circuit according to example embodiments may store a plurality of repair addresses. For example, if it is required to store x n-bit repair addresses in the repair circuit, where x is a natural number equal to or greater than two, the repair circuit according to example embodiments may include x master fuses and (x*n) address fuses. The x repair addresses may be stored in the repair circuit by respectively and/or sequentially performing the positive and/or negative program operations based on the repair control signal RCON. The output address may be provided by directly outputting the x repair addresses or by comparing the normal address with the x repair addresses.

Figure 9:
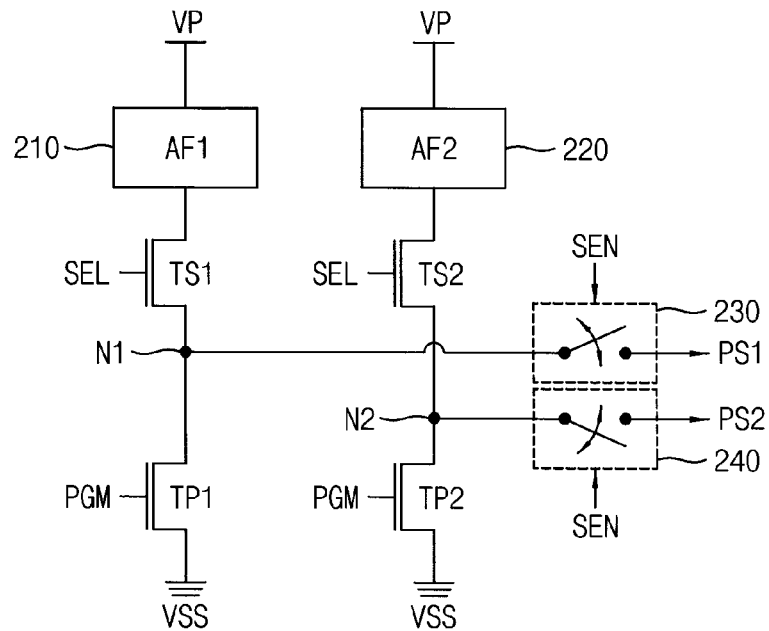
FIG. 9 is a diagram illustrating a fuse circuit according to example embodiments.

FIG. 9 is a diagram illustrating a fuse circuit according to example embodiments.

Referring to FIG. 9, a fuse circuit 200 includes a first anti-fuse element 210, a first selection transistor TS1, a first program transistor TP1, a first switch 230, a second anti-fuse element 220, a second selection transistor TS2, a second program transistor TP2 and a second switch 240. For example, each of the first and second anti-fuse elements 210 and 220 may include one anti-fuse element either connected to one or more transistors or not connected to a transistor. In one embodiment, the fuse circuit 200 may be included in the first fuse circuit 110 and the second fuse circuit 120.

The first selection transistor TS1 is connected between the first anti-fuse element 210 and a first node N1. The first program transistor TP1 is connected between the first node N1 and a ground voltage VSS. The first switch 230 is connected to the first node N1 and selectively outputs a first program output signal PS1. The first program output signal PS1 may correspond to a result of programming the first anti-fuse element 210.

The second anti-fuse element 220 is electrically disconnected from the first anti-fuse element 210. The second selection transistor TS2 is connected between the second anti-fuse element 210 and a second node N2. The second program transistor TP2 is connected between the second node N2 and the ground voltage VSS. The second switch 240 is connected to the second node N2 and selectively outputs a second program output signal PS2. The second program output signal PS2 may correspond to a result of programming the second anti-fuse element 220.

In some example embodiments, a program voltage VP may be applied to a first terminal of the first anti-fuse element 210 and a first terminal of the second anti-fuse element 220, respectively. As will be described with reference to FIG. 11, the first anti-fuse element 210 and the second anti-fuse element 220 may be respectively programmed at different levels of the program voltage VP.

In some example embodiments, a selection signal SEL may be commonly applied to a gate electrode of the first selection transistor TS1 and a gate electrode of the second selection transistor TS2, and a program control signal PGM may be commonly applied to a gate electrode of the first program transistor TP1 and a gate electrode of the second program transistor TP2. As will be described with reference to FIG. 10A, when the selection signal SEL and the program control signal PGM are activated, the first anti-fuse element 210 and the second anti-fuse element 220 may be substantially simultaneously programmed.

In some example embodiments, a switch control signal SEN may be commonly applied to the first switch 230 and the second switch 240. As will be described with reference to FIG. 10B, when the selection signal SEL and the switch control signal SEN are activated and the program control signal PGM are deactivated, the first program output signal PS1 and the second program output signal PS2 may be substantially simultaneously output.

The fuse circuit 200 according to example embodiments may include two anti-fuse elements 210 and 220 that are respectively programmed at the different levels of the program voltage VP, and thus the fuse circuit 200 may have a relatively improved program characteristic. In addition, two anti-fuse elements 210 and 220 may be electrically disconnected from each other, and thus the anti-fuse elements 210 and 220 may be substantially simultaneously programmed without degrading the program characteristic. For example, during a program operation, a current path of the first anti-fuse element 210 and a current path of the second anti-fuse element 220 are different from each other. Accordingly, the fuse circuit 200 may have a relatively short program time that is used to program (e.g., rupture) the first and second anti-fuse elements 210 and 220.

Figure 10A:
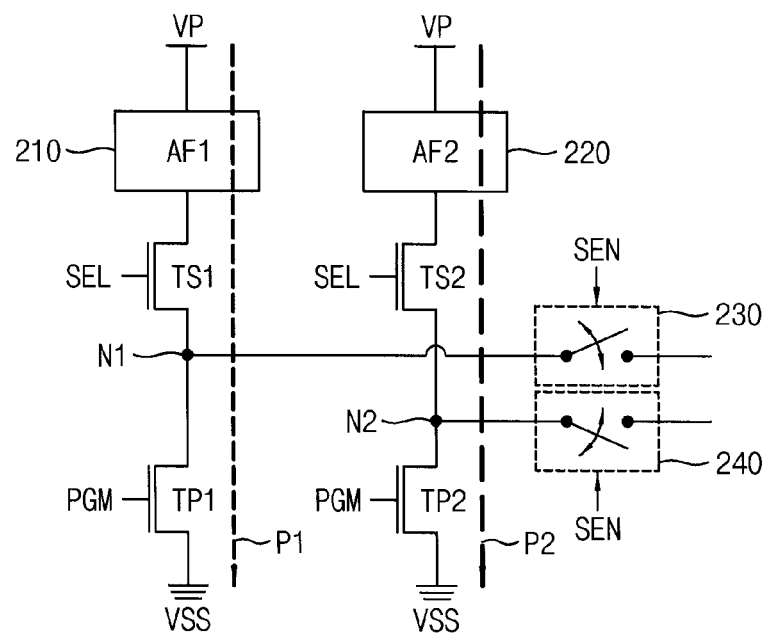
FIGS. 10A, 10B and 11 are diagrams for describing an operation of the fuse circuit of FIG. 9 according to example embodiments.
Figure 10B:
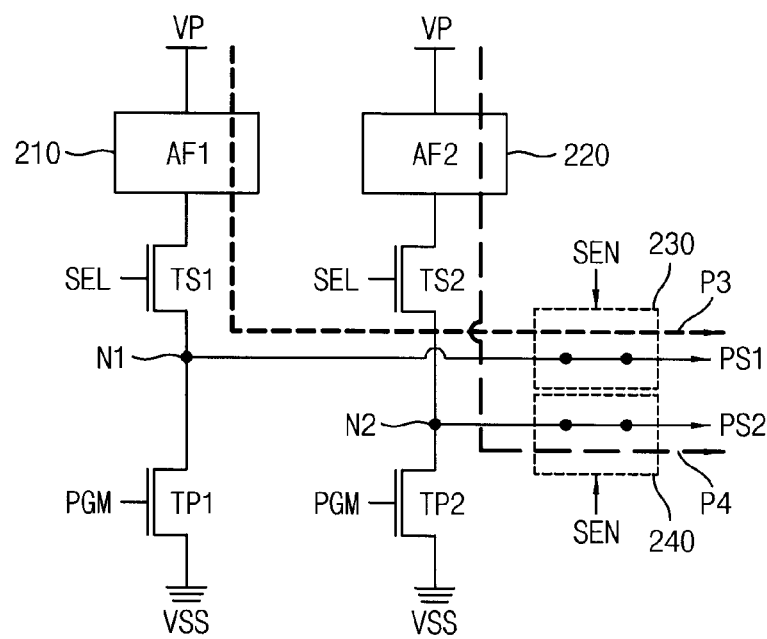
Figure 11:
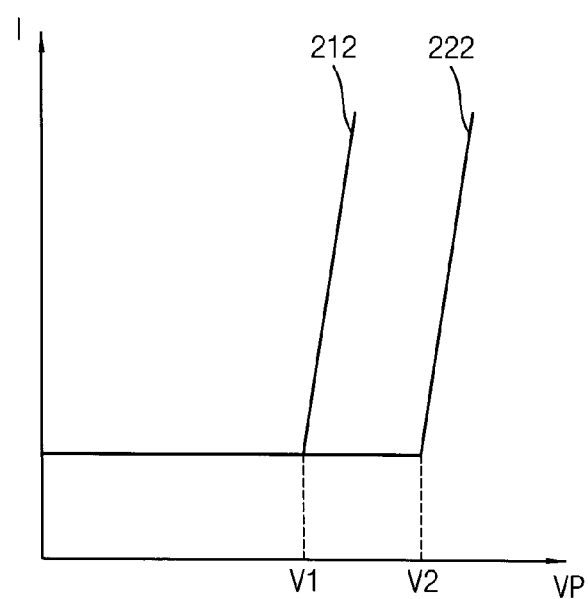

FIGS. 10A, 10B and 11 are diagrams for describing an operation of the fuse circuit of FIG. 9 according to example embodiments. FIG. 10A illustrates an operation of the fuse circuit 200 of FIG. 9 in a program mode. FIG. 10B illustrates an operation of the fuse circuit 200 of FIG. 9 in a sensing mode. FIG. 11 illustrates breakdown voltages of the first and second anti-fuse elements 210 and 220 in FIG. 9.

Referring to FIG. 10A, the program voltage VP, the selection signal SEL and the program control signal PGM may be activated and the switch control signal SEN may be deactivated in the program mode. A first path P1 may be formed from the program voltage VP to the ground voltage VSS via the first node N1. The first anti-fuse element 210 may be programmed (e.g., ruptured) based on a current flowing through the first path P1. Similarly, a second path P2 may be formed from the program voltage VP to the ground voltage VSS via the second node N2. The second anti-fuse element 220 may be programmed (e.g., ruptured) based on a current flowing through the second path P2.

As described above, the first path P1 and the second path P2 may be electrically disconnected from each other, but may be substantially simultaneously formed. Thus, the first and second anti-fuse elements 210 and 220 may be independently and substantially simultaneously programmed.

Referring to FIG. 10B, the program voltage VP, the selection signal SEL and the switch control signal SEN may be activated and the program control signal PGM may be deactivated in the sensing mode. A third path P3 may be formed from the program voltage VP to the first switch 230 via the first node N1. The first program output signal PS1 may be provided through the third path P3. Similarly, a fourth path P4 may be formed from the program voltage VP to the second switch 240 via the second node N2. The second program output signal PS2 may be provided through the fourth path P4.

As described above, the third path P3 and the fourth path P4 may be substantially simultaneously formed. Thus, the first and second program output signals PS1 and PS2 may be substantially simultaneously output.

Referring to FIG. 11, a reference numeral 212 denotes a level of current which flows through the first anti-fuse element 210 and a reference numeral 222 denotes a level of current which flows through the second anti-fuse element 220 when the program voltage VP is applied to the first terminal of the first anti-fuse element 210 and the first terminal of the second anti-fuse element 220. The first anti-fuse element 210 may be programmed (e.g., ruptured) at a first level V1 of the program voltage VP. For example, an oxide included in the first anti-fuse element 210 may be broken down at the first level V1 of the program voltage VP, and thus the first anti-fuse element 210 may be conducted when the program voltage VP having a level equal to or greater than the first level V1 is applied to the first terminal of the first anti-fuse element 210. Similarly, the second anti-fuse element 220 may be programmed (e.g., ruptured) at a second level V2 of the program voltage VP. For example, an oxide included in the second anti-fuse element 220 may be broken down at the second level V2 of the program voltage VP, and thus the second anti-fuse element 220 may be conducted when the program voltage VP having a level equal to or greater than the second level V2 is applied to the first terminal of the second anti-fuse element 220.

In some example embodiments, the first anti-fuse element 210 may include a depletion type metal oxide semiconductor (MOS) transistor, and the second anti-fuse element 220 may include an enhancement type MOS transistor. In other example embodiments, each of the first and second anti-fuse elements 210 and 220 may include a depletion type MOS transistor. In still other example embodiments, each of the first and second anti-fuse elements 210 and 220 may include an enhancement type MOS transistor.

Figure 12:
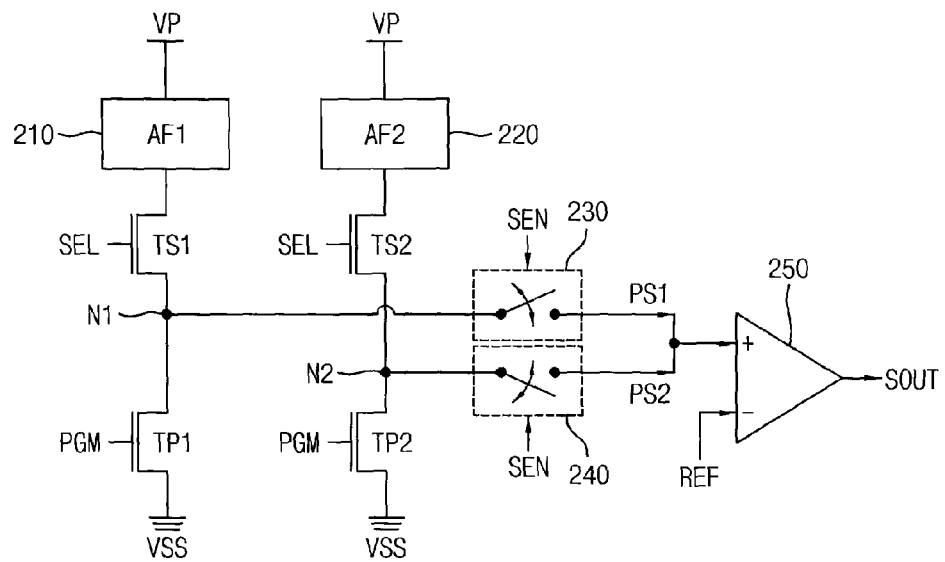
FIG. 12 is a diagram illustrating a fuse circuit according to example embodiments.

FIG. 12 is a diagram illustrating a fuse circuit according to example embodiments.

Referring to FIG. 12, a fuse circuit 200a includes a first anti-fuse element 210, a first selection transistor TS1, a first program transistor TP1, a first switch 230, a second anti-fuse element 220, a second selection transistor TS2, a second program transistor TP2 and a second switch 240. The fuse circuit 200a may further include a sensing circuit 250.

The first anti-fuse element 210, the first selection transistor TS1, the first program transistor TP1, the first switch 230, the second anti-fuse element 220, the second selection transistor TS2, the second program transistor TP2 and the second switch 240 in the fuse circuit 200a of FIG. 12 may be substantially the same as the first anti-fuse element 210, the first selection transistor TS1, the first program transistor TP1, the first switch 230, the second anti-fuse element 220, the second selection transistor TS2, the second program transistor TP2 and the second switch 240 in the fuse circuit 200 of FIG. 9, respectively.

The sensing circuit 250 may generate a sensing output signal SOUT based on a reference signal REF, the first program output signal PS1 and the second program output signal PS2. The sensing output signal SOUT may indicate whether a program operation for the first and second anti-fuse elements 210 and 220 has been performed. As described above with reference to FIG. 10B, the first and second program output signals PS1 and PS2 may be output in the sensing mode, and thus the sensing output signal SOUT may be output in the sensing mode.

In some example embodiments, the first and second anti-fuse elements 210 and 220 may be electrically disconnected from each other in the program mode and may be electrically connected to each other in the sensing mode. For example, as described above with reference to FIG. 10A, the first and second anti-fuse elements 210 and 220 may be programmed in the program mode. In the sensing mode, the first and second program output signals PS1 and PS2 may be substantially simultaneously provided to a first input terminal of the sensing circuit 250. The sensing circuit 250 may determine a logic level of the sensing output signal SOUT by comparing a sum (e.g., a current sum) of the first and second program output signals PS1 and PS2 applied to the first input terminal of the sensing circuit 250 with the reference signal REF applied to a second input terminal of the sensing circuit 250. For example, the sensing output signal SOUT may have the first logic level (e.g., "1") when at least one of the first and second anti-fuse elements 210 and 220 has been programmed and may have the second logic level (e.g., "0") when both the first and second anti-fuse elements 210 and 220 are unprogrammed.

The fuse circuit 200a according to example embodiments may include two anti-fuse elements 210 and 220 that are respectively and independently programmed at the different levels of the program voltage VP and may generate the sensing output signal SOUT based on the sum of the first and second program output signals PS1 and PS2. Accordingly, the sensing output signal SOUT generated by the fuse circuit 200a may have a relatively improved reliability even if the at least one of the first and second anti-fuse elements 210 and 220 is abnormally programmed.

According to example embodiments, the master fuse (e.g., the master fuse 112 in FIG. 1 or FIG. 7) and the address fuses (e.g., the address fuses 122a, . . . , 122n in FIG. 1 or FIG. 7) that are included in the repair circuit (e.g., the repair circuit 100 of FIG. 1 or the repair circuit 100a of FIG. 7) may be implemented with the fuse circuit 200 of FIG. 9 or the fuse circuit 200a of FIG. 12, respectively.

Although the example embodiments are described above based on the fuse circuit including two anti-fuse elements, the fuse circuit according to example embodiments may include more than three anti-fuse elements that are electrically disconnected from each other during a program operation.

Figure 13:
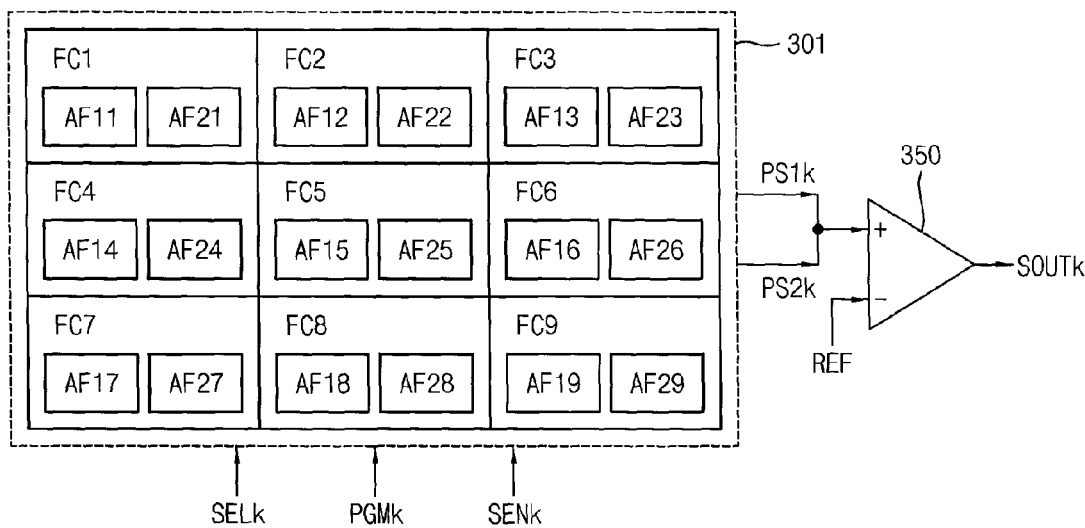
FIG. 13 is a diagram illustrating a fuse array circuit according to example embodiments.

FIG. 13 is a diagram illustrating a fuse array circuit according to example embodiments.

Referring to FIG. 13, a fuse array circuit 300 includes a fuse array 301 and a sensing circuit 350.

The fuse array 301 includes a plurality of fuse circuits FC1, FC2, FC3, FC4, FC5, FC6, FC7, FC8 and FC9 that are arranged in a matrix form. For convenience of illustration, FIG. 13 illustrates the fuse array 301 including nine fuse circuits, however, the number of the fuse circuits included in the fuse array is not limited thereto.

In one embodiment, each of the plurality of fuse circuits FC1, . . . , FC9 may be the fuse circuit 200 of FIG. 9. Each of the plurality of fuse circuits FC1, . . . , FC9 may include a respective one of first anti-fuse elements AF11, AF12, AF13, AF14, AF15, AF16, AF17, AF18 and AF19 and a respective one of second anti-fuse elements AF21, AF22, AF23, AF24, AF25, AF26, AF27, AF28 and AF29. Each of the first anti-fuse elements AF11, . . . , AF19 and the respective one of the second anti-fuse elements AF21, . . . , AF29 may be electrically disconnected from each other during a program operation.

Each of the plurality of fuse circuits FC1, . . . , FC9 in the fuse array 301 may operate in the program mode or in the sensing mode and may generate a first program output signal PS1$k$ and a second program output signal PS2$k$ based on a selection signal SELk, a program control signal PGMk and a switch control signal SENk, where k is a natural number equal to or greater than one and equal to or smaller than n, and where n is nine in FIG. 13. For example, when a first selection signal (e.g., SEL1) and a first program control signal (e.g., PGM1) of a first fuse circuit FC1 are activated (e.g., in the program mode for the first fuse circuit FC1), first and second anti-fuse elements AF11 and AF21 included in the first fuse circuit FC1 may be programmed. When the first selection signal (e.g., SEL1) and a first switch control signal (e.g., SEN1) of the first fuse circuit FC1 are activated (e.g., in the sensing mode for the first fuse circuit FC1), first and second program output signals (e.g., PS11 and PS21) may be output from the first fuse circuit FC1.

The sensing circuit 350 may generate a sensing output signal SOUTk based on a reference signal REF, the first program output signal PS1$k$ and the second program output signal PS2$k$ in the sensing mode. For example, when the first and second program output signals (e.g., PS11 and PS21) are output from the first fuse circuit FC1, the sensing circuit 350 may generate a sensing output signal (e.g., SOUT1) of the first fuse circuit FC1 that indicates whether a program operation for the first and second anti-fuse elements AF11 and AF21 included in the first fuse circuit FC1 has been performed.

According to example embodiments, the master fuse (e.g., the master fuse 112 in FIG. 1 or FIG. 7) and the address fuses (e.g., the address fuses 122a, . . . , 122n in FIG. 1 or FIG. 7) that are included in the repair circuit (e.g., the repair circuit 100 of FIG. 1 or the repair circuit 100a of FIG. 7) may be implemented with the fuse array circuit 300 of FIG. 13.

Figure 14:
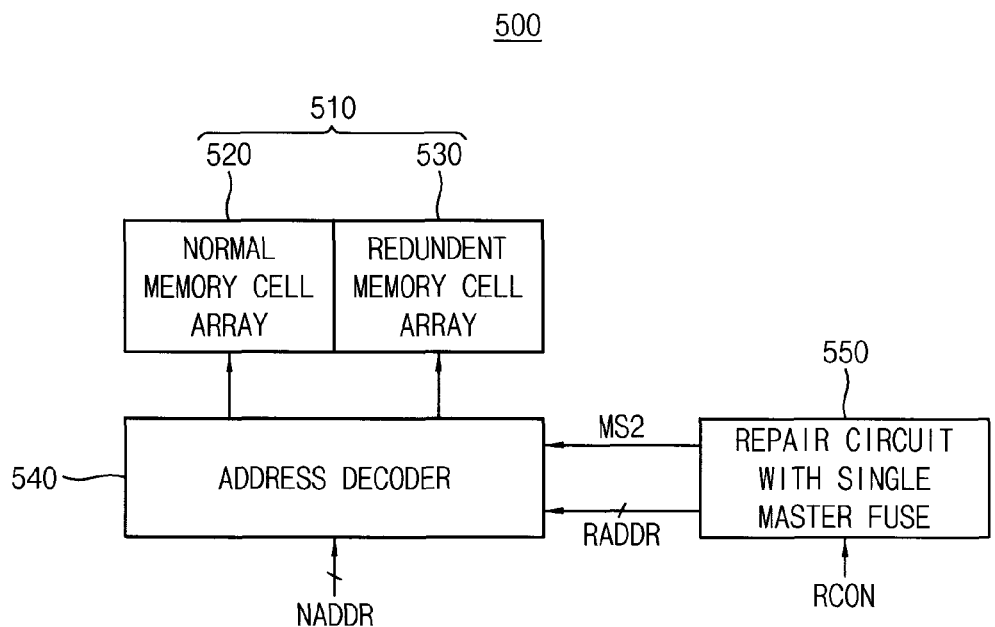
FIGS. 14 and 15 are block diagrams illustrating a semiconductor memory device according to example embodiments.
Figure 15:
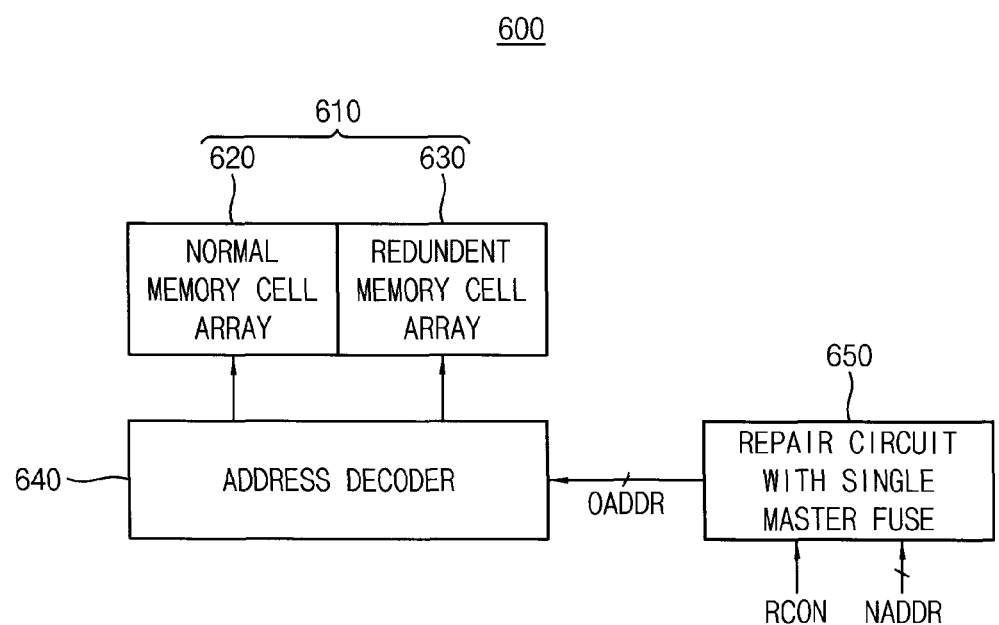

FIGS. 14 and 15 are block diagrams illustrating a semiconductor memory device according to example embodiments.

Referring to FIG. 14, a semiconductor memory device 500 includes a memory cell array 510, an address decoder 540 and a repair circuit 550. The semiconductor memory device 500 may comprise, for example, a semiconductor chip.

The memory cell array 510 includes a normal memory cell array 520 and a redundant memory cell array 530. The normal memory cell array 520 may include a plurality of normal memory cells, and the redundant memory cell array 530 may include a plurality of redundant memory cells. The redundant memory cell array 530 may include a plurality of memory blocks scattered in memory cell array 510.

The repair circuit 550 includes a master fuse and a plurality of address fuses as disclosed above. The repair circuit 550 performs a program operation based on a repair control signal RCON when the plurality of normal memory cells include at least one defective memory cell. The repair circuit 550 may be the repair circuit 100 of FIG. 1 and may generate a repair address RADDR and a second master signal MS2 that indicates whether the program operation has been performed on the repair circuit 550.

The address decoder 540 selectively accesses the normal memory cells or the redundant memory cells based on an output of the repair circuit 550. For example, when the second master signal MS2 has the first logic level (e.g., "1"), the address decoder 540 may access the redundant memory cells based on the repair address RADDR corresponding to a normal address NADDR. When the second master signal MS2 has the second logic level (e.g., "0"), the address decoder 540 may determines that the program operation has not been performed and may access the normal memory cells based on the normal address NADDR.

According to example embodiments, the address decoder 540 may include a row decoder that selects one of wordlines of the memory cell array 510 and/or a column decoder that selects one of bitlines of the memory cell array 510. For example, the repair circuit 550 may perform a row repair operation and/or a column repair operation. In the row repair operation, a defective row including the defective memory cell in the memory cell array 510 may be replaced with a redundancy row including the redundancy memory cell. In the column repair operation, a defective column including the defective memory cell in the memory cell array 510 may be replaced with a redundancy column including the redundancy memory cell.

Referring to FIG. 15, a semiconductor memory device 600 includes a memory cell array 610, an address decoder 640 and a repair circuit 650.

The memory cell array 610 includes a normal memory cell array 620 and a redundant memory cell array 630. The normal memory cell array 620 may include a plurality of normal memory cells, and the redundant memory cell array 630 may include a plurality of redundant memory cells.

The repair circuit 650 includes a master fuse and a plurality of address fuses as disclosed above. The repair circuit 650 performs a program operation based on a repair control signal RCON when the plurality of normal memory cells include at least one defective memory cell. The repair circuit 650 may be the repair circuit 100a of FIG. 8 and may output one of a repair address RADDR and a normal address NADDR as an output address OADDR based on the logic level of the second master signal MS2 that indicates whether the program operation has been performed.

The address decoder 640 selectively accesses the normal memory cells or the redundant memory cells based on an output (e.g., the output address OADDR) of the repair circuit 650.

Figure 16:
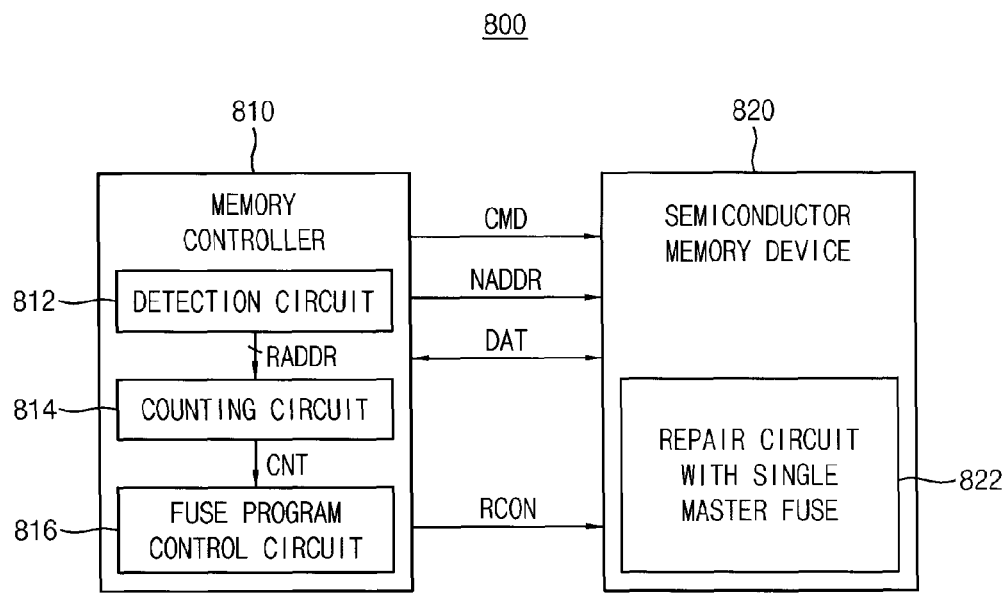
FIGS. 16 and 17 are block diagrams illustrating a test system according to example embodiments.
Figure 17:
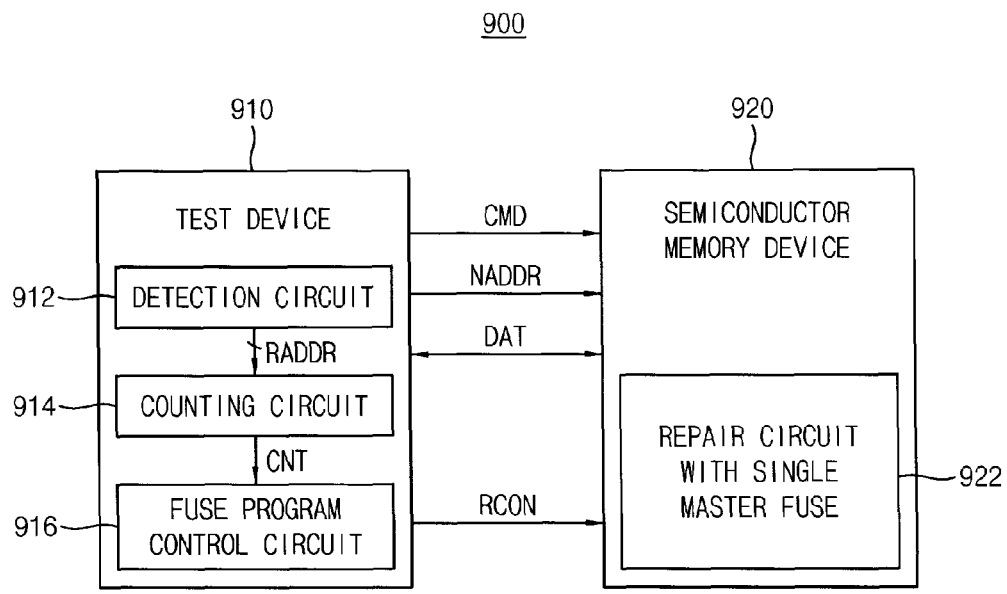

FIGS. 16 and 17 are block diagrams illustrating a test system according to example embodiments.

Referring to FIG. 16, a test system 800 includes a memory controller 810 and a semiconductor memory device 820.

The semiconductor memory device 820 may be one of the semiconductor memory device 500 of FIG. 14 and the semiconductor memory device 600 of FIG. 15 and may include a repair circuit 822. The repair circuit 822 may be one of the repair circuit 100 of FIG. 1 and the repair circuit 100a of FIG. 7 and may include a master fuse and a plurality of address fuses. The master fuse and the plurality of address fuses may be implemented with the fuse circuit 200 of FIG. 9 or the fuse circuit 200a of FIG. 12, respectively, or may be implemented with the fuse array circuit 300 of FIG. 13. Accordingly, the repair circuit 822 may have a relatively small size and a relatively short program time, and the semiconductor memory device 820 including the repair circuit 822 may have a relatively short test time.

The memory controller 810 may control an operation of the semiconductor memory device 820. The memory controller 810 may perform a test operation on the semiconductor memory device 820 based on a command CMD, a normal address NADDR and data DAT and may generate a repair control signal RCON based on the result of the test operation.

The memory controller 810 may include a detection circuit 812, a counting circuit 814 and a fuse program control circuit 816. The detection circuit 812 may detect a repair address RADDR based on the result of the test operation when the semiconductor memory device 820 includes at least one defective memory cell. The counting circuit 814 may generate a count signal CNT by counting the number of first bits of the repair address RADDR having the first logic level (e.g., "1"). The fuse program control circuit 816 may determine a program scheme for the repair circuit 822 based on the count signal CNT. For example, the program scheme for the repair circuit 822 may be determined based on the example of FIG. 3. The memory controller 810 may generate the repair control signal RCON for performing one of the positive program operation and the negative program operation.

Referring to FIG. 17, a test system 900 includes a test device 910 and a semiconductor memory device 920.

The semiconductor memory device 920 may be one of the semiconductor memory device 500 of FIG. 14 and the semiconductor memory device 600 of FIG. 15 and may include a repair circuit 922. The repair circuit 922 may be one of the repair circuit 100 of FIG. 1 and the repair circuit 100a of FIG. 7 and may include a master fuse and a plurality of address fuses. The master fuse and the plurality of address fuses may be implemented with the fuse circuit 200 of FIG. 9 or the fuse circuit 200a of FIG. 12, respectively, or may be implemented with the fuse array circuit 300 of FIG. 13. Accordingly, the repair circuit 922 may have a relatively small size and a relatively short program time, and the semiconductor memory device 920 including the repair circuit 922 may have a relatively short test time.

The test device 910 may perform a test operation on the semiconductor memory device 920 based on a command CMD, a normal address NADDR and data DAT and may generate a repair control signal RCON based on the result of the test operation. The test device 910 may include a detection circuit 912, a counting circuit 914 and a fuse program control circuit 916. The detection circuit 912, the counting circuit 914 and the fuse program control circuit 916 included in the test device 910 of FIG. 17 may be substantially the same as the detection circuit 812, the counting circuit 814 and the fuse program control circuit 816 included in the memory controller 810 of FIG. 16, respectively.

Figure 18:
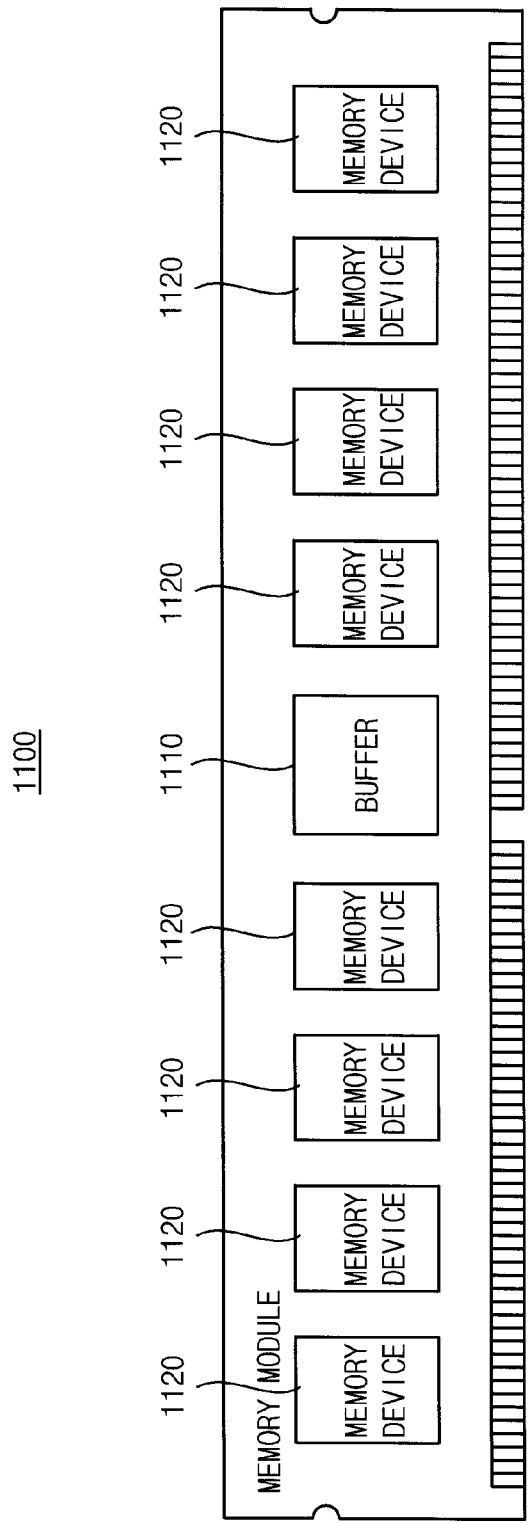
FIG. 18 is a block diagram illustrating a memory module according to example embodiments.

FIG. 18 is a block diagram illustrating a memory module according to example embodiments.

Referring to FIG. 18, a memory module 1100 may include a plurality of semiconductor memory devices 1120. According to example embodiments, the memory module 1100 may be an unbuffered dual in-line memory module (UDIMM), a registered dual in-line memory module (RDIMM), a fully buffered dual in-line memory module (FBDIMM), a load reduced dual in-line memory module (LRDIMM), etc.

The memory module 1100 may further include a buffer 1110. The buffer 1110 may receive a command, an address and/or data from a memory controller (not illustrated) through a plurality of transmission lines, and may provide the command, the address and/or the data to the plurality of semiconductor memory devices 1120 by buffering the command, the address and/or the data.

In some example embodiments, data transmission lines between the buffer 1110 and the semiconductor memory devices 1120 may be connected in a point-to-point topology. In some example embodiments, command/address transmission lines between the buffer 1110 and the semiconductor memory devices 1120 may be connected in a multi-drop topology, a daisy-chain topology, a fly-by daisy-chain topology, or the like. Since the buffer 1110 buffers all of the command, the address and the data, the memory controller may interface with the memory module 1100 by driving only a load of the buffer 1110. Accordingly, the memory module 1100 may include more semiconductor memory devices 1120 and/or more memory ranks, and a memory system may include more memory modules.

Each of the semiconductor memory devices 1120 may be one of the semiconductor memory device 500 of FIG. 14 and the semiconductor memory device 600 of FIG. 15 and may include a repair circuit. The repair circuit may be one of the repair circuit 100 of FIG. 1 and the repair circuit 100a of FIG. 7 and may include a master fuse and a plurality of address fuses. The master fuse and the plurality of address fuses may be implemented with the fuse circuit 200 of FIG. 9 or the fuse circuit 200a of FIG. 12, respectively, or may be implemented with the fuse array circuit 300 of FIG. 13. Accordingly, the repair circuit may have a relatively small size and a relatively short program time, and each of the semiconductor memory devices 1120 may have a relatively short test time.

Figure 19:
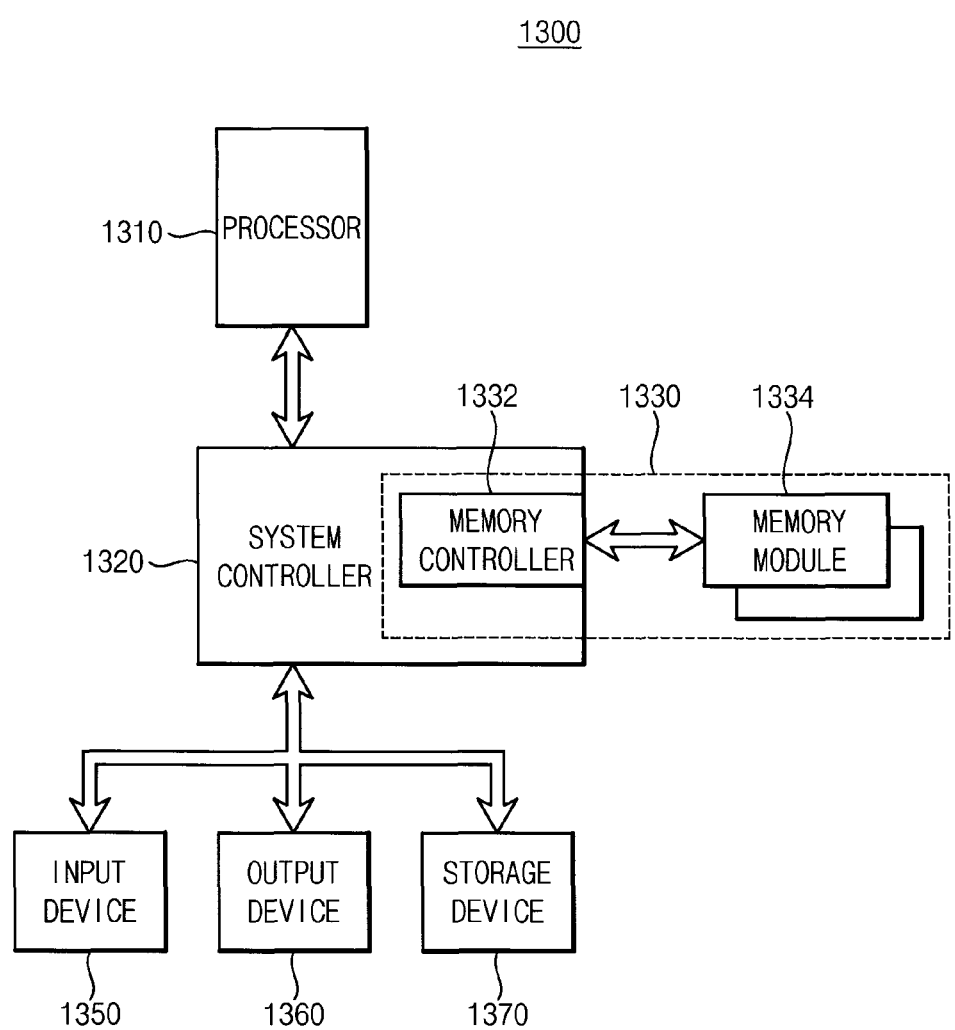
FIG. 19 is a block diagram illustrating a computing system according to example embodiments.

FIG. 19 is a block diagram illustrating a computing system according to example embodiments.

Referring to FIG. 19, a computing system 1300 may include a processor 1310, a system controller 1320 and a memory system 1330. The computing system 1300 may further include an input device 1350, an output device 1360, a storage device 1370, other electronic components, etc.

The memory system 1330 may include a plurality of memory modules 1334 and a memory controller 1332 for controlling the memory modules 1334. The memory modules 1334 may include a plurality of semiconductor memory devices. According to example embodiments, each of the semiconductor memory devices may include at least one volatile memory, such as a dynamic random access memory (DRAM), a static random access memory (SRAM), and/or at least one nonvolatile memory, such as an electrically erasable programmable read-only memory (EEPROM), a flash memory, a phase change random access memory (PRAM), a resistance random access memory (RRAM), a magnetic random access memory (MRAM), a ferroelectric random access memory (FRAM), a nano floating gate memory (NFGM), a polymer random access memory (PoRAM). The memory controller 1332 may be included in the system controller 1320.

Each of the memory modules 1334 may be the memory module 1100 of FIG. 18. Each of the semiconductor memory devices included in each of the memory modules 1334 may be one of the semiconductor memory device 500 of FIG. 14 and the semiconductor memory device 600 of FIG. 15 and may include a repair circuit. The repair circuit may be one of the repair circuit 100 of FIG. 1 and the repair circuit 100a of FIG. 7 and may include a master fuse and a plurality of address fuses. The master fuse and the plurality of address fuses may be implemented with the fuse circuit 200 of FIG. 9 or the fuse circuit 200a of FIG. 12, respectively, or may be implemented with the fuse array circuit 300 of FIG. 13. Accordingly, the repair circuit may have a relatively small size and a relatively short program time, and each of the semiconductor memory devices may have a relatively short test time.

The processor 1310 may perform various computing functions, such as executing specific software for performing specific calculations or tasks. The processor 1310 may be connected to the system controller 1320 via a processor bus. The system controller 1320 may be connected to the input device 1350, the output device 1360 and the storage device 1370 via an expansion bus. As such, the processor 1310 may control the input device 1350, the output device 1360 and the storage device 1370 using the system controller 1320.

The above described embodiments may be used in a semiconductor memory device having a repair circuit or system or electronic device including the semiconductor memory device, such as a mobile phone, a smart phone, a personal digital assistants (PDA), a portable multimedia player (PMP), a digital camera, a digital television, a set-top box, a music player, a portable game console, a navigation device, a personal computer (PC), a server computer, a workstation, a tablet computer, a laptop computer, a smart card, a printer, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A repair circuit comprising:
    a first fuse circuit including a first fuse and configured to generate a first master signal indicating whether the first fuse has been programmed;
    a second fuse circuit including a plurality of second fuses and configured to generate a first address indicating whether each of the plurality of second fuses has been programmed;
    a determination circuit configured to generate a detection signal based on the first master signal and the first address, the detection signal indicating whether a negative program operation has been performed on the second fuse circuit; and
    an output circuit configured to:
        generate a second master signal based on the first master signal and the detection signal, the second master signal indicating whether a program operation has been performed on the first and second fuse circuits, and
        generate a repair address corresponding to a defective input address based on the first address and the detection signal when the program operation has been performed on the first and second fuse circuits.

2. The repair circuit of claim 1, wherein the program operation is performed on the first fuse circuit or the second fuse circuit based on a repair control signal,
    wherein a positive program operation is performed on respective fuses of the second fuse circuit corresponding to bits having a first logic level when a number of bits having the first logic level of the repair address is smaller than a half of a number of bits of the repair address, and
    wherein the negative program operation is performed on respective fuses of the second fuse circuit corresponding to bits having a second logic level opposite to the first logic level when the number of bits having the first logic level of the repair address is equal to or greater than a half of the number of bits of the repair address and is smaller than the number of bits of the repair address.

3. The repair circuit of claim 2, wherein the positive program operation is performed on respective fuses of the second fuse circuit corresponding to bits having the first logic level when the number of bits having the first logic level is equal to the number of bits of the repair address.

4. The repair circuit of claim 1, wherein the determination circuit is configured to determine whether the negative program operation has been performed on the second fuse circuit, and activate the detection signal when at least one of bits of the first address has a first logic level and the first master signal has a second logic level opposite to the first logic level.

5. The repair circuit of claim 4, wherein the output circuit is configured to output an inverted first master signal as the second master signal and output an inverted first address as the repair address when the detection signal is activated, or
    wherein the output circuit is configured to output the first master signal as the second master signal and output the first address as the repair address when the detection signal is deactivated.

6. The repair circuit of claim 1, wherein the output circuit includes:
    a first inverter configured to invert the first master signal;
    a first output switch configured to output one of the first master signal and the inverted first master signal as the second master signal based on the detection signal;
    a plurality of second inverters configured to invert bits of the first address; and
    a plurality of second output switches configured to output one of the first address and the inverted first address as the repair address based on the detection signal.

7. The repair circuit of claim 1, wherein the first fuse includes:
    at least two anti-fuse elements configured to be respectively programmed at different levels of a program voltage.

8. The repair circuit of claim 7, wherein the at least two anti-fuse elements are substantially simultaneously programmed.

9. The repair circuit of claim 1, further comprising:
    a repair control circuit configured to output either the repair address or an input address as an output address based on the second master signal,
    wherein the input address receives from an outside of a semiconductor memory device.

10. The repair circuit of claim 9, wherein the repair control circuit is configured to output the repair address as the output address when the second master signal has a first logic level, and output the input address as the output address when the second master signal has a second logic level opposite to the first logic level.

11. The repair circuit of claim 9, wherein the repair control circuit includes:
    a master latch configured to store a logic level of the second master signal;
    a plurality of address latches configured to store logic levels of bits of the repair address; and a plurality of address comparators configured to output one of the repair address and the input address as the output address based on the second master signal.

12. A fuse circuit comprising:
a first anti-fuse element;
a first selection transistor connected between the first anti-fuse element and a first node;
a first program transistor connected between the first node and a ground voltage;
a first switch connected to the first node and configured to selectively output a first program output signal;
a second anti-fuse element electrically disconnected from the first anti-fuse element;
a second selection transistor connected between the second anti-fuse element and a second node;
a second program transistor connected between the second node and the ground voltage; and
a second switch connected to the second node and configured to selectively output a second program output signal.

13. The fuse circuit of claim 12, wherein a selection signal is commonly applied to a gate electrode of the first selection transistor and a gate electrode of the second selection transistor,
wherein a program control signal is commonly applied to a gate electrode of the first program transistor and a gate electrode of the second program transistor, and
wherein the first anti-fuse element and the second anti-fuse element are substantially simultaneously programmed when the selection signal and the program control signal are activated.

14. The fuse circuit of claim 13, wherein a switch control signal is commonly applied to the first switch and the second switch, and
wherein the first program output signal and the second program output signal are substantially simultaneously output when the selection signal and the switch control signal are activated.

15. The fuse circuit of claim 12, further comprising:
a sensing circuit configured to generate a sensing output signal based on a reference signal, the first program output signal and the second program output signal, the sensing output signal indicating whether a program operation on either the first anti-fuse element or the second anti-fuse element has been performed.

16. A repair circuit of a semiconductor memory device, the repair circuit comprising:
a first fuse circuit including a first fuse, and configured to output a first master signal indicating whether the first fuse has been programmed;
a second fuse circuit including a plurality of second fuses, wherein each of the second fuses is configured to be programmed based on a result of comparing a number of bits of a defective input address having a first logic level with a number of bits of the defective input address having a second logic level opposite to the first logic level, and
wherein the second fuse circuit is configured to generate a first address using the second fuses based on a program operation that depends on the result of comparing;
a determination circuit configured to generate a detection signal based on the first master signal and the first address, the detection signal indicating whether a negative program operation has been performed on the second fuse circuit; and
an output circuit configured to output either the first address or a second address that is an inverted address of the first address as a repair address in response to the detection signal, wherein a logic level of each of the bits of the repair address is the same as that of the defective input address.

17. The repair circuit of claim 16, wherein the first fuse circuit and the second fuse circuit are further configured such that:
a program is performed on the first fuse and a positive program is performed on the second fuses corresponding to bits having the first logic level when a majority of bits in the defective input address have the second logic level or the number of bits having the first logic level equal to the number of bits having the second logic level, and
a negative program is performed on second fuses corresponding to bits having the second logic level when a majority of bits in the defective input address have the first logic level.

18. The repair circuit of claim 16, further comprising:
a second master signal generator configured to output either the first master signal or the inverted first master signal as a second master signal in response to the detection signal; and
in response to the second master signal, a repair control circuit configured to output either the repair address or an input address received from an outside of the semiconductor memory device to an address decoder of the semiconductor memory device so that one or more memory cells of either a normal memory cell array or a redundant memory cell array of the semiconductor memory device are selected.

19. The repair circuit of claim 16,
wherein the repair control circuit outputs the repair address when either the first fuse has been programmed and the detection signal has the second logic level or the first fuse is not programmed and the detection signal has the first logic level, and
wherein the repair control circuit outputs the input address when the first fuse is not programmed and the detection signal has the second logic level.

20. The repair circuit of claim 16, wherein each of the first fuse circuit and the second fuse circuit includes a first anti-fuse element and a second anti-fuse element each configured to be programmed at different levels of a program voltage, and
wherein the first and second anti-fuse elements are substantially simultaneously programmed.

* * * * *